(12) United States Patent
Wang et al.

(10) Patent No.: US 9,001,245 B2
(45) Date of Patent: Apr. 7, 2015

(54) PIXEL STRUCTURE WITH MULTIPLE TRANSFER GATES

(75) Inventors: Xinyang Wang, Antwerp (BE); Guy Meynants, Retie (BE); Bram Wolfs, Nieuwrode (BE)

(73) Assignee: Cmosis NV, Antwerp (BE)

( * ) Notice: Subject to any disclaimer, the term of this patent is extended or adjusted under 35 U.S.C. 154(b) by 714 days.

(21) Appl. No.: 12/977,935

(22) Filed: Dec. 23, 2010

(65) Prior Publication Data
US 2012/0002089 A1    Jan. 5, 2012

(30) Foreign Application Priority Data
Jan. 13, 2010  (GB) .................................. 1000523.9

(51) Int. Cl.
*H01L 27/146* (2006.01)
*H04N 5/335* (2011.01)
*H04N 5/374* (2011.01)
(Continued)

(52) U.S. Cl.
CPC .... *H01L 27/14603* (2013.01); *H01L 27/14609* (2013.01); *H01L 27/14656* (2013.01); *H04N 5/35572* (2013.01); *H04N 5/3742* (2013.01); *H04N 5/3745* (2013.01); *H01L 27/14641* (2013.01)

(58) Field of Classification Search
CPC .................................................. H04N 5/2353
USPC ......................................................... 348/297
See application file for complete search history.

(56) References Cited

U.S. PATENT DOCUMENTS 6,724,426 B1 *  4/2004  Berezin et al. ................ 348/308
7,106,373 B1    9/2006  Dierickx
7,436,496 B2   10/2008  Kawahito
(Continued)

FOREIGN PATENT DOCUMENTS

DE   698 05 555 T2    1/2003
EP      2023613 A1 *  2/2009  ............ H01L 27/146
(Continued)

OTHER PUBLICATIONS

Search Report of British Patent Office in GB1000523.9, Mar. 22, 2010.
(Continued)

*Primary Examiner* — Roberto Velez
*Assistant Examiner* — Cynthia Segura
(74) *Attorney, Agent, or Firm* — Bacon & Thomas, PLLC

(57) ABSTRACT

A pixel structure comprises a photo-sensitive element for generating charge in response to incident light. A first transfer gate is connected between the photo-sensitive element and a first charge conversion element. A second transfer gate is connected between the photo-sensitive element and a second charge conversion element. An output stage outputs a first value related to charge at the first charge conversion element and outputs a second value related to charge at the second charge conversion element. A controller controls operation of the pixel structures and causes a pixel structure. The controller causes the pixel structure to: acquire charges on the photo-sensitive element during an exposure period; transfer a first portion of the charges acquired during the exposure period from the photo-sensitive element to the first charge conversion element via the first transfer gate; and transfer a second portion of the charges acquired during the exposure period from the photo-sensitive element to the second charge conversion element via the second transfer gate.

24 Claims, 18 Drawing Sheets

(51) Int. Cl.
*H04N 5/3745* (2011.01)
*H04N 5/355* (2011.01)

(56) References Cited

U.S. PATENT DOCUMENTS

| | | | |
|---|---|---|---|
| 7,531,858 B2* | 5/2009 | Lee | 257/292 |
| 7,843,029 B2 | 11/2010 | Kawahito et al. | |
| 8,264,673 B2* | 9/2012 | Mase et al. | 356/5.01 |
| 8,520,104 B2* | 8/2013 | Fossum et al. | 348/294 |
| 2006/0284051 A1* | 12/2006 | Ko et al. | 250/208.1 |
| 2007/0158770 A1* | 7/2007 | Kawahito | 257/431 |
| 2008/0108166 A1* | 5/2008 | Park et al. | 438/59 |
| 2009/0032852 A1* | 2/2009 | Song et al. | 257/292 |
| 2009/0090845 A1* | 4/2009 | Yin et al. | 250/208.1 |
| 2009/0166684 A1* | 7/2009 | Yahav et al. | 257/225 |
| 2009/0210193 A1* | 8/2009 | Nagase | 702/152 |
| 2009/0261235 A1 | 10/2009 | Lahav et al. | |
| 2009/0284731 A1 | 11/2009 | Jin et al. | |
| 2010/0187401 A1 | 7/2010 | Kawahito | |
| 2011/0019045 A1* | 1/2011 | Lin | 348/296 |
| 2011/0090385 A1* | 4/2011 | Aoyama et al. | 348/308 |
| 2011/0134298 A1* | 6/2011 | Aoyama | 348/311 |
| 2012/0257093 A1* | 10/2012 | Sa et al. | 348/302 |
| 2013/0001404 A1* | 1/2013 | Meynants | 250/208.1 |
| 2013/0222681 A1* | 8/2013 | Wan | 348/371 |

FOREIGN PATENT DOCUMENTS

| | | | |
|---|---|---|---|
| EP | 2023613 A1 | 2/2009 | |
| EP | 2187237 A1 | 5/2010 | |
| EP | 2296368 A1 | 3/2011 | |
| JP | 2004056048 A | 7/2002 | |
| JP | 2005159067 A | 11/2003 | |
| JP | 2005164363 A | 12/2003 | |
| JP | 2009047662 A1 * | 3/2009 | G01S 17/89 |
| WO | 2007/083704 A1 | 7/2007 | |
| WO | 2008/069141 A1 | 6/2008 | |
| WO | 2009/025373 A1 | 2/2009 | |
| WO | 2009/147862 A1 | 12/2009 | |
| WO | WO 2009147862 A1 * | 12/2009 | G02B 7/40 |

OTHER PUBLICATIONS

Further Search Report of British Patent Office in GB1000523.9, Aug. 4, 2010.

Examination Report of the European Patent Office regarding EP 10 195 800.7, May 16, 2012.

Examination Report of the European Patent Office regarding EP 10 195 800.7, Dec. 20, 2011.

Examination Report of the European Patent Office in regard to European Patent Application No. 10195800.7, Apr. 27, 2011.

* cited by examiner

US 9,001,245 B2

PIXEL STRUCTURE WITH MULTIPLE TRANSFER GATES

FIELD OF THE INVENTION

This invention relates to pixel structures and to arrays of pixel structures which can be used in applications such as image sensors.

BACKGROUND TO THE INVENTION

Pixel structures, as used in image sensors and other sensor applications, have a finite dynamic range. The dynamic range is the range, typically expressed as a ratio, between the largest intensity value that can be resolved by the pixel and the smallest intensity value that can be resolved by the pixel. When used in image sensors, such as CMOS active pixel image sensors, this limits the ratio between the brightest and darkest image values that can be resolved by the image sensor. The smallest intensity value is limited by the read noise of the pixel. The largest intensity value is limited by the amount of charges that can be stored inside the pixel and effectively read out.

Various techniques have been proposed to extend the dynamic range. A summary of various high dynamic range techniques is given in the article "Wide-Dynamic-Range CMOS Image Sensors—Comparative Performance Analysis", A. Spivak et al, IEEE trans. El. Dev, vol. 56, No. 11, pp. 2446, November 2009. Techniques have been used which compress the photosignal in a piecewise linear way by partial reset (e.g. U.S. Pat. No. 7,106,373) or by charge division during readout (e.g. DE69805555). In such pixels, colour reconstruction is difficult since it is not exactly known which slope is used close to the kneepoints of the image. Another disadvantage of such pixels is that the exposure period is different for different parts of the response curve. Pixels in bright areas have received a shorter exposure period than pixels in a dark area. This results in distortion artefacts in moving images.

Other techniques have been proposed for increased dynamic range, like pixels with time-to-saturation counters, but they result in much more complex pixel implementations. One technique to achieve a high dynamic range uses different gain in the readout path (e.g. B. Fowler, "Wide Dynamic Range Low Light Level CMOS Image Sensor", proc. International Image Sensor Workshop, Bergen, June 2009). The photodiode signal is read out through a single floating diffusion, which must be designed to handle the maximum charge packet that is read out from the pixel. This method only solves the dynamic range limitations in the readout chain outside of the pixel array.

"Non-Linearity in Wide Dynamic Range CMOS Image Sensors Utilizing a Partial Charge Transfer Technique", Suhaidi Shafie et al, Sensors 2009, vol. 9, p. 9452-9467 describes another technique of partial charge transfer from the photodiode to the floating diffusion by multiple transfers through the same transfer gate. The gate voltage bias is modulated to control the maximum amount of charge transferred in each cycle. This requires subsequent readings from the pixel, which results in more time required to read the pixel data. Furthermore, the voltage control of the transfer gate is important, and threshold voltage variations on transfer gates will cause pixel-to-pixel non-uniformities in the different transfers.

The present invention seeks to provide an alternative way of improving the dynamic range of a pixel structure.

SUMMARY OF THE INVENTION

An aspect of the invention provides a pixel structure comprising a photo-sensitive element for generating charge in response to incident light. The pixel structure further comprises a first transfer gate connected between the photo-sensitive element and a first charge conversion element. The pixel structure further comprises a second transfer gate connected between the photo-sensitive element and a second charge conversion element. The pixel structure further comprises an output stage for outputting a first value related to charge at the first charge conversion element and for outputting a second value related to charge at the second charge conversion element. The pixel structure further comprises a controller for controlling operation of the pixel structure. The controller is arranged to cause the pixel structure to: acquire charges on the photo-sensitive element during an exposure period. The controller is further arranged to transfer a first portion of the charges acquired during the exposure period from the photo-sensitive element to the first charge conversion element via the first transfer gate. The controller is further arranged to transfer a second portion of the charges acquired during the exposure period from the photo-sensitive element to the second charge conversion element via the second transfer gate.

This pixel structure is particularly advantageous in applications requiring high dynamic range and low noise. Both rolling-shutter and global shutter pixel can be realised with embodiments of the pixel structure. The second charge conversion element provides an "overflow" region for charge from the photo-sensitive element which would saturate the first charge conversion element, thereby allowing a higher dynamic range compared to a pixel structure having only the first charge conversion element. This also allows the first charge conversion element to be formed with a smaller capacitance and higher conversion gain than would normally be provided for a pixel structure having one charge conversion element, allowing lower noise read out. The first value and second value output from the pixel structure are used to reconstruct a final image value.

An increase in dynamic range can be achieved with a pixel structure in which the first charge conversion element has the same capacitance as the second charge conversion element. However, a greater increase in dynamic range can be achieved where the second charge conversion element has a larger capacitance than the first charge conversion element, and hence a different conversion gain.

Advantageously the second transfer gate is wider than the first transfer gate. This reduces image lag and allows a more complete charge transfer from the photo-sensitive element following exposure.

A further advantage of the pixel structure is that the second charge conversion element can be used as a store for overflow charge during the exposure period. The controller is arranged to, during the exposure period, operate the second transfer gate to allow overflow charge to transfer to the second charge conversion element; cause the output stage to output a third value related to charge stored in the second charge conversion element; and reset the second charge conversion element before transferring a first portion of the charges to the first charge conversion element and transferring the second portion of the charges to the second charge conversion element.

The output stage can comprise first read out circuitry for outputting a value related to charge at the first charge conversion element and second read out circuitry for outputting a value related to charge at the second charge conversion element. Alternatively, the output stage can comprise shared read out circuitry for selectively outputting a value related to charge at the first charge conversion element and for selectively outputting a value related to charge at the second charge conversion element.

The pixel structure can comprise a larger number of transfer gates and charge conversion elements. More generally, the pixel structure can comprise N transfer gates and N charge conversion elements, where N is an integer ≥3, each transfer gate connected between the photo-sensitive element and a respective charge conversion element. The output stage is arranged to output a value related to charge at each of the N charge conversion elements.

Advantageously, the photo-sensitive element is a pinned photodiode or a photogate. Advantageously, the first charge conversion element and the second charge conversion element are floating diffusions.

A further aspect of the invention provides a pixel array comprising a plurality of the pixel structures.

The component count of the array can be reduced by sharing the first charge conversion element and the second charge conversion element of one pixel structure with neighbouring pixel structures in the array.

A further aspect of the invention provides a method of operating a pixel structure comprising a photo-sensitive element for generating charge in response to incident light, a first transfer gate connected between the photo-sensitive element and a first charge conversion element, a second transfer gate connected between the photo-sensitive element and a second charge conversion element and an output stage. The method comprises causing the photo-sensitive element to acquire charges during an exposure period. The method further comprises transferring a first portion of the charges acquired during the exposure period from the photo-sensitive element to the first charge conversion element via the first transfer gate. The method further comprises transferring a second portion of the charges acquired during the exposure period from the photo-sensitive element to the second charge conversion element via the second transfer gate.

Advantageously, the pixel array is fabricated using CMOS technology. Another embodiment of the invention is implemented in Charge Coupled Device (CCD) technology.

BRIEF DESCRIPTION OF THE DRAWINGS

Embodiments of the invention will be described, by way of example only, with reference to the accompanying drawings in which.

DESCRIPTION OF PREFERRED EMBODIMENTS

Figure 1:
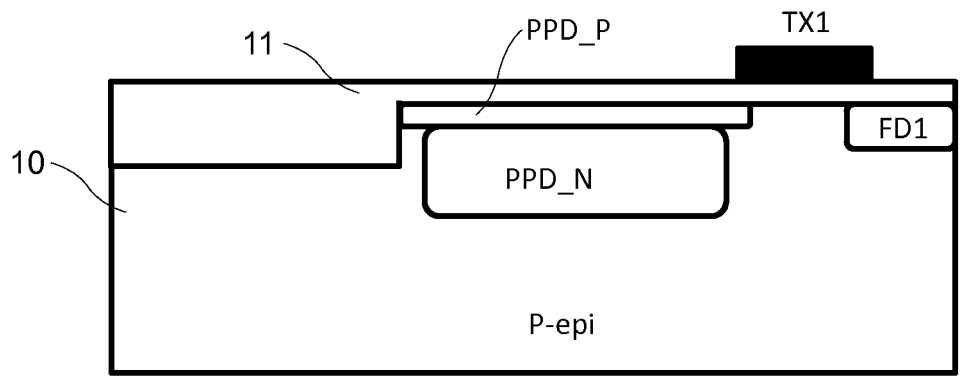
FIG. 1 shows part of a conventional pixel structure.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The terms "horizontal" and "vertical" are used in this specification to differentiate two orthogonal directions and do not imply any particular orientation of the array.

By way of background, FIG. 1 shows a cross-section through part of a conventional pixel structure in which a pinned photodiode PPD is used as a photo-sensitive element. The pinned photodiode PPD comprises regions PPD_P, PPD_N in a semiconductor material 10. Other components formed in, or on, the semiconductor material 10 include an insulator layer (e.g. SiO2) 11, a transfer gate TX1 and a floating diffusion region FD1. The transfer gate TX1 controls transfer of charge from the pinned photodiode PPD to the floating diffusion FD1. The floating diffusion FD1 is a capacitor, which is primarily used to convert charge transferred from the photodiode PPD into a voltage signal which can be read by a read-out amplifier of the pixel.

Figure 2A:
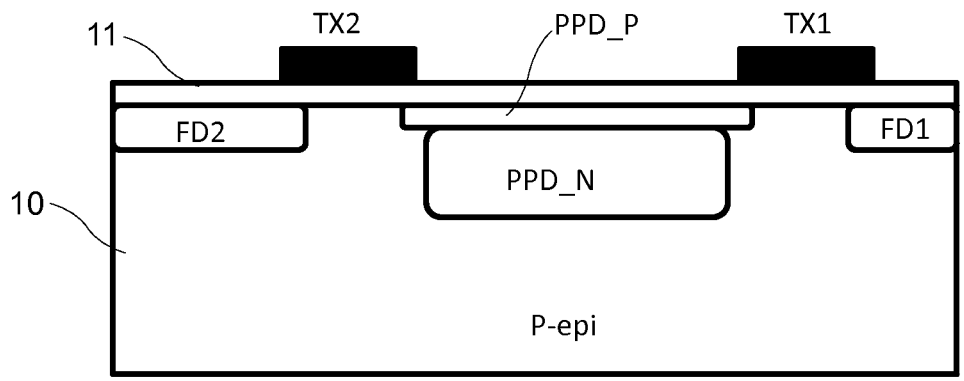
FIGS. 2A and 2B show part of a pixel structure according to an embodiment of the invention, with two transfer gates and two floating diffusions.
Figure 2B:
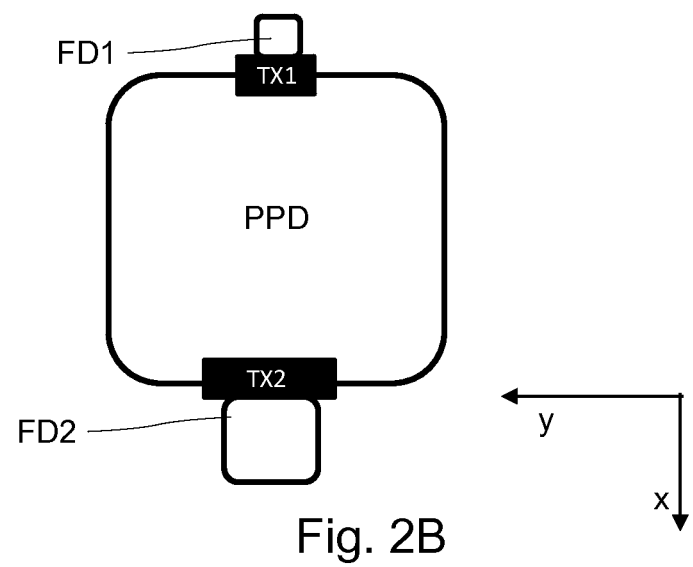

FIGS. 2A and 2B show part of a pixel structure according to an embodiment of the invention. FIG. 2A shows a cross-section through the pixel structure and FIG. 2B shows a plan view of the pixel structure. In this embodiment, a pinned photodiode PPD is used as a photosensitive element. The pinned photodiode PPD comprises regions PPD_P, PPD_N in a semiconductor material 10. A transfer gate TX1 and a floating diffusion region FD1 are provided, as in FIG. 1. Other components formed in, or on, the semiconductor material 10 include a second transfer gate TX2 and a second floating diffusion region FD2. The transfer gate TX2 controls transfer of charge from the pinned photodiode PPD to the floating diffusion FD2. Alternative names for a floating diffusion are a sense node or a charge conversion node. The floating diffusions FD1, FD2 are primarily used to convert charge transferred from the photodiode PPD into a voltage signal which can be read by a buffer amplifier in the pixel, with charge only being stored for a short period at the floating diffusion. In some types of pixel, such as global shutter pixels, charge can be stored at the floating diffusion FD for a longer period of time.

In advantageous embodiments, the second floating diffusion region FD2 has a larger capacitance than the first floating diffusion region FD1. In the following description, it is assumed FD2 has a larger capacitance than FD1. The larger capacitance of the second floating diffusion region FD2 can be achieved in various ways. One way is to form the second floating diffusion FD2 as a device having a larger area than the first floating diffusion region FD1, as shown in FIGS. 2A, 2B. The increase in area of FD2 can be achieved in one, or advantageously, two, lateral directions (shown as x, y in FIGS. 2A, 2B). Additionally, or alternatively, the capacitance can be increased by changing doping levels, adding gate capacitance or adding a plate capacitor. This gives the second floating diffusion region FD2 a larger capacitance, but a lower conversion gain, than the first floating diffusion region FD1. Advantageously, the second transfer gate TX2 has a greater width compared to the first transfer gate TX1. The width of the gate determines image lag and also influences the conversion gain. The "width" dimension of the transfer gate is the dimension in the direction parallel to the edge of the photodiode PPD, i.e. direction "y" in FIG. 2B.

The transfer gates TX1, TX2 are very similar to ordinary NMOS transistors. Each of the solid blocks shown in FIGS. 2A, 2B is the gate area of a transfer gate, which is isolated from the silicon by a thin layer of gate dielectric 11, such as SiO2. At one side, the structure is connected to the photodiode which forms the source of the transistor. At the other side, the gate is connected to an n+ implant FD1/FD2, similar to the source/drain implants of NMOS. The channel which conducts the electrons from source to drain is usually at the surface of the silicon. The doping of the silicon under the gate also plays a role, and is used to control the threshold voltage of the gate. The bulk concentration is usually lower than of the standard NMOS, because this may also form a barrier which makes the charge transfer through the transfer gate less efficient.

A floating diffusion FD1, FD2 is usually realised by an n+ ion implantation self-aligned to the transfer gate. This forms a junction with the underlying p-type bulk material (p-epi). The junction capacitance is used to convert the stored charge to voltage. Additional capacitance may be provided, in the form of extra plate capacitors (i.e. two conductors with a thin dielectric), or by extra gate capacitance of the input stage of the amplifier connected to the floating diffusion. This amplifier usually is a simple NMOS source follower. The capacitance of a floating diffusion can be varied by factors such as: junction area and implantation, underlying bulk concentration, area of the gate of the readout transistor connected to the FD, additional plate capacitors connected to the FD, and overlap capacitance of the transistors connected to the FD (reset, transfer).

Figure 3:
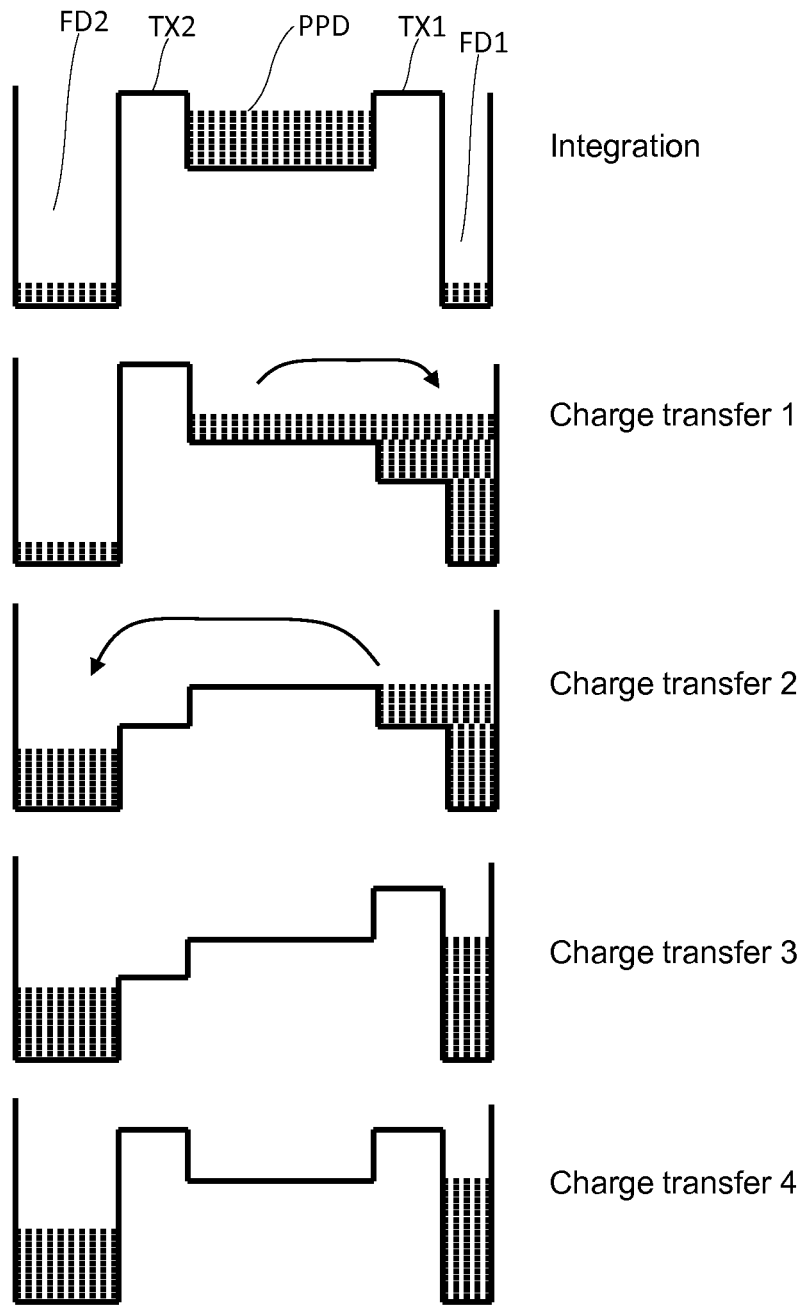
FIG. 3 shows operation of the pixel of FIG. 2 under saturation conditions.
Figure 4:
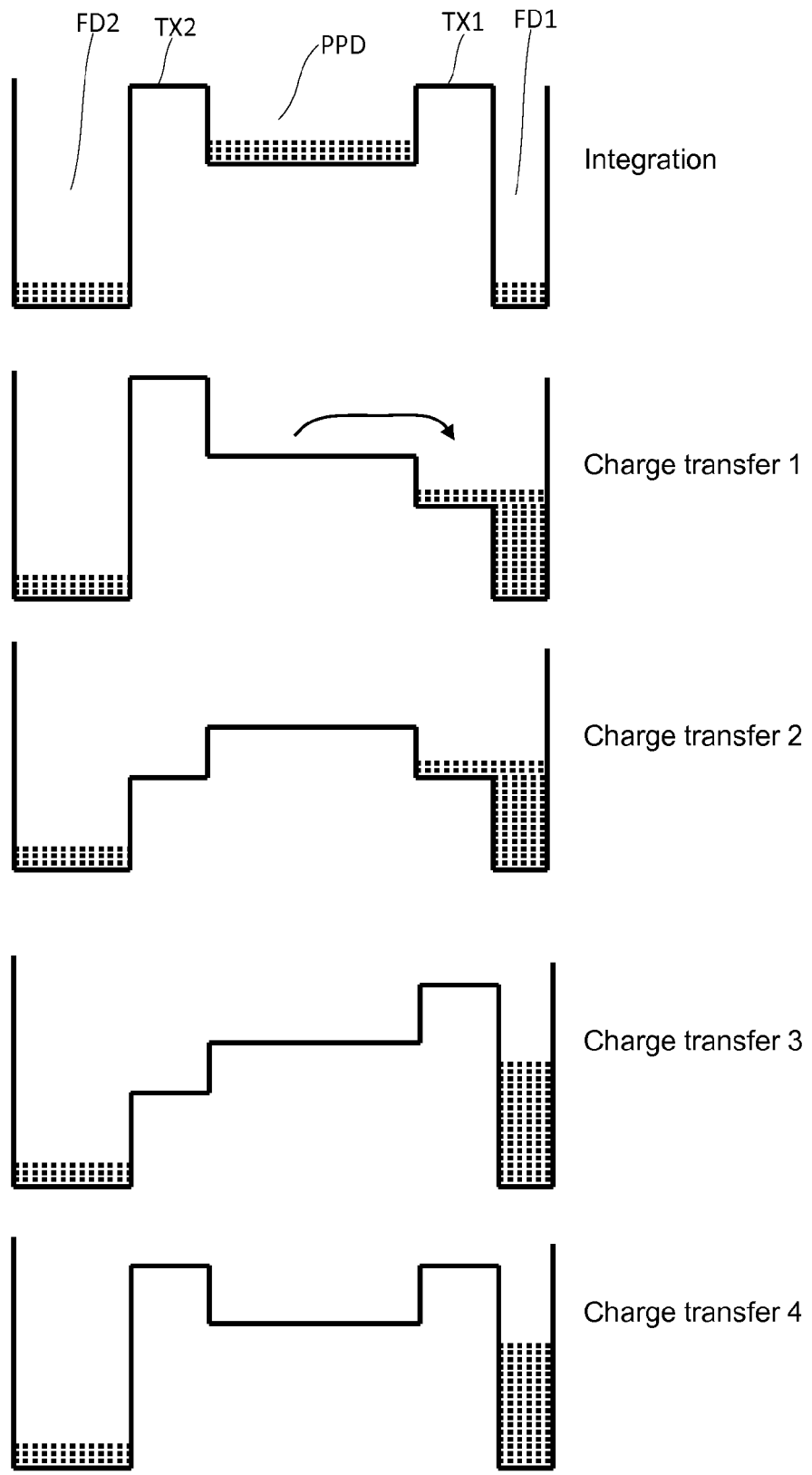
FIG. 4 shows operation of the pixel of FIG. 2 under non-saturation conditions.

FIGS. 3 and 4 each show a set of potential diagrams for the pixel of FIG. 2, showing the states of the pinned photodiode, transfer gates TX1, TX2 and floating diffusions FD1, FD2 during operation of the pixel. FIG. 3 shows operation under conditions when saturation occurs in the first floating diffusion FD1. FIG. 4 shows operation under conditions when no saturation occurs in the first floating diffusion FD1. FD2 has a larger capacitance than FD1.

FIG. 3 starts with exposure of the pixel to light. This period is also known as integration. Both TX1 and TX2 are switched off (thereby blocking movement of charge), and the photon-generated electrons are accumulated in the pinned photodiode PPD. Both FD1 and FD2 are held in reset through a reset transistor. After integration, both FD1 and FD2 are released from reset and the charge transfer starts. Four charge transfer steps are shown. During charge transfer 1, TX1 is on, and the photon-electrons flow from the photodiode PPD to FD1. Charges from the PPD saturates FD1, and charge sharing occurs between the photodiode and FD1. During charge transfer 2, TX2 is switched on. The remaining charges flow to FD2. The potential of FD1 remains at the pinning voltage of the PPD. During charge transfer 3, TX1 is switched off. Because TX2 is still on at this moment, all charges present on the photodiode PPD, and possibly underneath TX1, will be dumped to FD2 instead of FD1. Finally, during charge transfer 4, TX2 is switched off. All photon-generated electrons have been distributed between FD1 and FD2.

Figure 21:
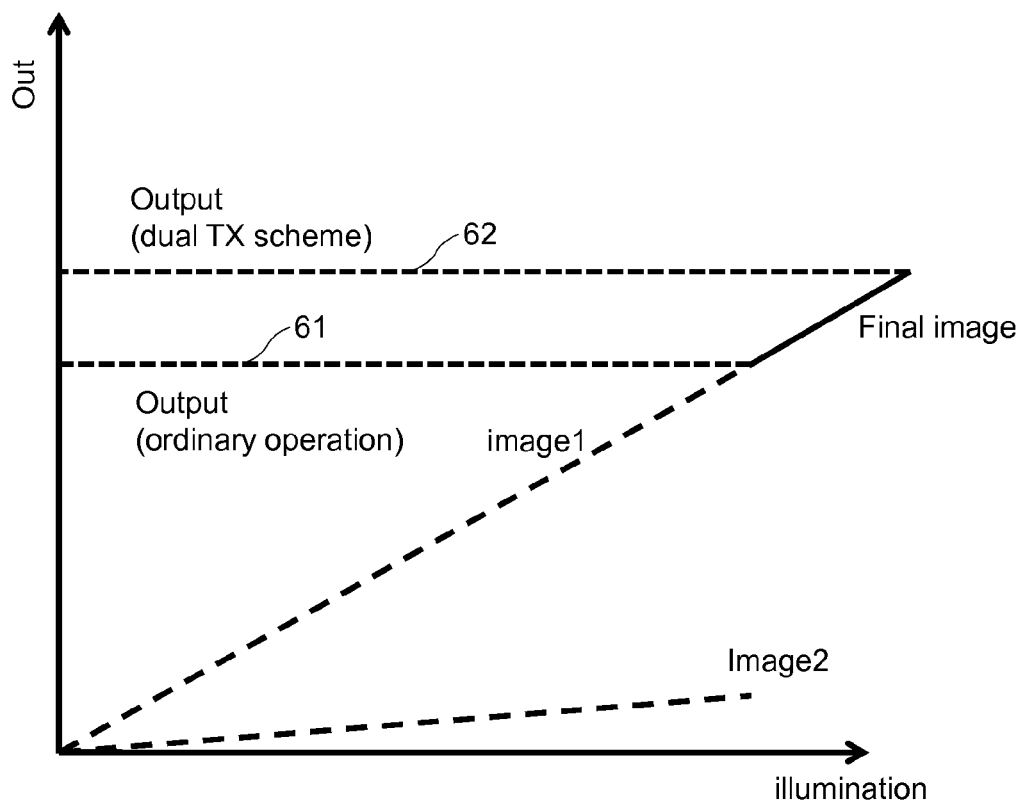
FIG. 21 shows an aspect of performance of the pixel.

FIG. 4 starts with integration. Both TX1 and TX2 are switched off (thereby blocking movement of charge), and the photon-generated electrons are accumulated in the pinned photodiode PPD. Both FD1 and FD2 are held in reset through a reset transistor (not shown). After integration, both FD1 and FD2 are released from reset and the charge transfer starts. During charge transfer 1, TX1 is on, and the photon-electrons flow from the photodiode PPD to FD1. If the quantity of charge is not sufficient to saturate FD1, i.e. no charge sharing occurs between PPD and FD1, these charges will stay in FD1. The remaining steps are as shown in FIG. 3. Although FD1 is not saturated, there may still be some movement of charge to FD2, for reasons described later with respect to FIG. 21.

The amount of charge stored in FD1 is always well-defined with, or without, charge sharing. As the conversion gain of FD2 is much less than the conversion gain of FD1, the potential level on both FD1 and FD2 can be read out afterwards to reconstruct an image with extended dynamic range. Another advantage of this scheme is that the TX1 transfer transistor can be designed relatively small to acquire a high conversion gain. The risk of image lag is eliminated by the additional transfer gate TX2 which will transfer any charge remaining on the photodiode due to an incomplete transfer under TX1. As the capacitance of FD2 is much higher than the capacitance of FD1, the conversion gain is much more (conversion gain is proportional to the inverse of the capacitance). The potential on FD1 changes very quickly (e.g. with 100 μV per electron dumped on FD1 if the conversion gain is 100 μV/e−) but also saturates quickly, since the allowed voltage swing on the floating diffusion is limited (e.g. 1 V, so only 10,000 e− can be converted). FD2 has a much smaller conversion gain (e.g. 10 μV/e−) and will saturate much later, only after 100,000 e−.

The read noise of a pixel is determined by noise in the pixel buffer amplifier. An advantage of the scheme is that the pixel allows to read the signal with a very high conversion gain through FD1. Meanwhile, for larger signals the entire range is covered by the reading through FD2. Because of the very high conversion gain of FD1, the noise of the buffer amplifier (which is added to the voltage signal) corresponds to a very low read noise level when the noise is expressed in electrons. For example, if the read noise of the output amplifier is 250 µV RMS, and the conversion gain is 100 µV/e− as in the above example, the read noise on the FD1 signal is only 2.5 electrons RMS. FD2 reading will have a much larger read noise, 25 electrons in case of 10 µV/e−, but the FD2 signal is only used for bright pixels, which have much larger signal levels. Furthermore, the photon shot noise on the signals of these bright pixels exceeds 25 electrons. This means that even for the FD2 reading, the noise added by the pixel buffer amplifier remains below the detectable limit.

Figure 5:
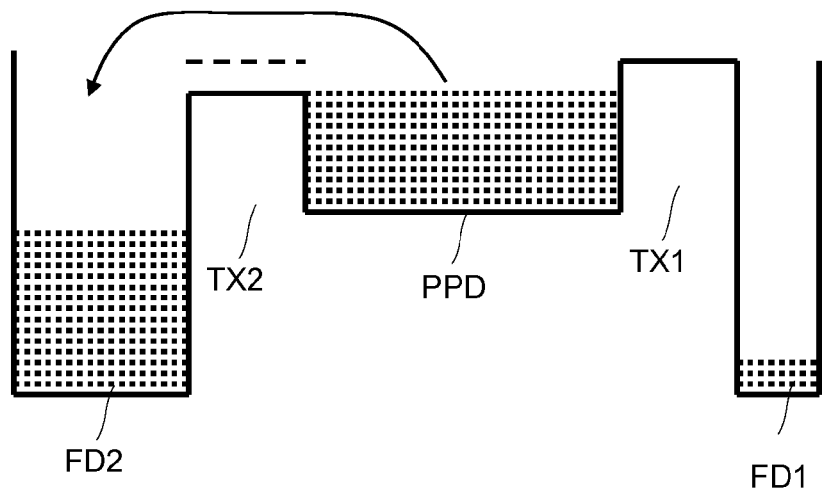
FIG. 5 shows another step of operating the pixel of FIG. 2.

In addition to the scheme described above, it is also possible to implement an extended dynamic range operation using the same pixel structure by allowing charge to overflow from the pinned photodiode PPD to FD2 during the integration step of FIGS. 3 and 4. FIG. 5 explains this operation. Only FD1 is held in reset during the modified integration step and FD2 is kept floating. TX2 is biased at an intermediate level which is below the reset level (shown as a dashed line), and above the "off" level, to allow charge to overflow to FD2. For heavily illuminated pixels, the pinned photodiode PPD is saturated quickly and the excess electrons will then flow to FD2 and accumulate in FD2. After integration, signal levels on FD2 are first readout as an additional data point to reconstruct the final image. Then, FD2 is reset and the same readout process (the steps "Charge transfer 1-Charge transfer 4" of FIGS. 3 and 4) are performed. It will be understood that the second floating diffusion FD2 can be used on two separate occasions during the process of exposing and reading a pixel. Firstly, the second floating diffusion FD2 can be used during the integration step as an overflow for charges which saturate the photodiode PPD. Secondly, the second floating diffusion FD2 can be used as a store of charges which overflow the first floating diffusion FD1.

Figure 6:
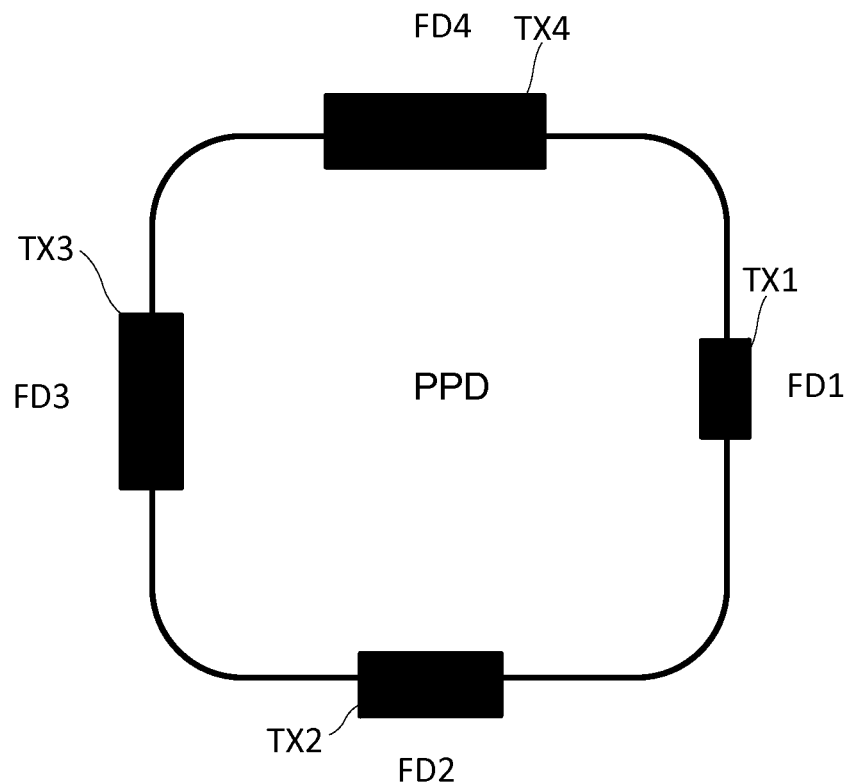
FIG. 6 shows part of a pixel structure according to an embodiment of the invention, with four transfer gates and floating diffusions.
Figure 7:
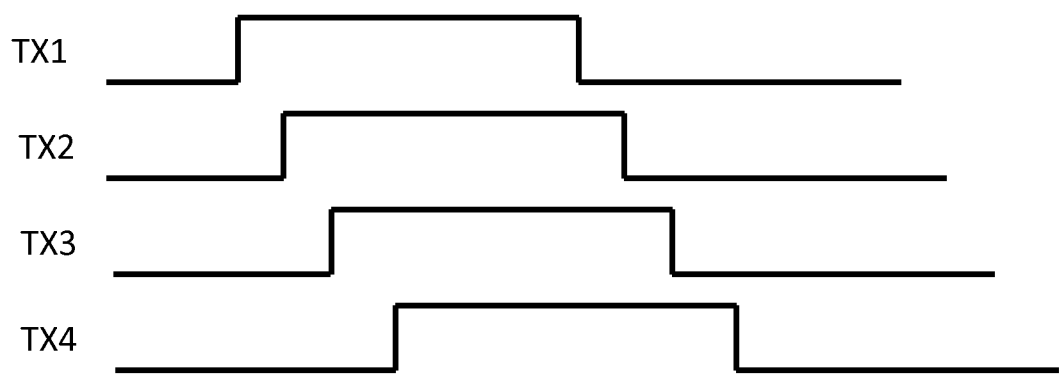
FIG. 7 shows a timing scheme for the pixel of FIG. 6.

FIGS. 2 to 5 show a pixel structure with two transfer gates and two floating diffusions. The scheme can be extended to other numbers of transfer gates and floating diffusions. FIG. 6 shows a pixel structure comprising a photodiode PPD and four transfer gates TX1-TX4. Each transfer gate is connected to a respective floating diffusion FD1-FD4. Each floating diffusion FD1-FD4 has a different capacitance. Advantageously, but not essentially, transfer gates TX1-TX4 have a size which matches the respective floating diffusion FD1-FD4. FIG. 7 shows a timing scheme for operating the pixel structure of FIG. 6. The transfer gates TX1-TX4 are switched on sequentially. TX1 is switched on first. TX pulses on the different transfer gates may, or may not, overlap. Advantageously, two of the transfer gates overlap at one time, during the operational cycle, e.g. TX1 and TX2 overlap, then TX2 and TX3 overlap, and so on.

Each transfer gate extends the dynamic range by the ratio of the floating diffusion capacitance. If only two TX gates are used, and the ratio between the conversion gains of FD1 and FD2 is too high, the read noise introduced by the buffer amplifier connected to FD2 is considerable. This noise, expressed in electrons, will be higher than the photon shot noise. The photon shot noise is proportional to the square root of the number of detected photocharges, and represents the statistical variation in the photocarrier generation process. The advantage of using multiple transfer gates is that the dynamic range can be further extended, and meanwhile the capacitance ratios between the different floating diffusions can be selected such that the read noise never exceeds the photon shot noise (except for the first floating diffusion FD1 which operates until dark).

In FIGS. 2A, 2B the transfer gates TX1, TX2 and floating diffusions FD1, FD2 are located on opposite sides of the photodiode PPD and in FIG. 6 the transfer gates TX1-TX4 and floating diffusions FD1-FD4 are located on four sides of the photodiode PPD. The transfer gates and floating diffusions can be positioned with different relative positions, as dictated by the physical layout of the pixel and the overall number of transfer gates and floating diffusions that need to be accommodated. For example, multiple transfer gates and floating diffusions could be located together on one side of the photodiode PPD.

Figure 8:
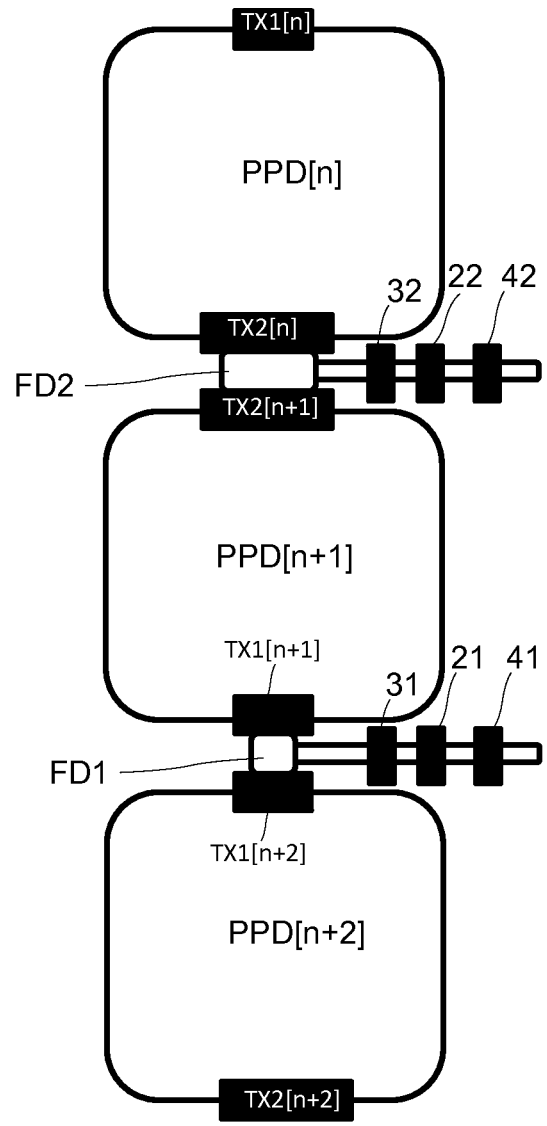
FIGS. 8 and 8A show shared pixel architectures.

FIG. 8 shows an example of a shared pixel architecture using the pixel structure of FIG. 2 comprising photodiodes PPD[n], PPD[n+1], PPD[n+2]. On one side of pinned photodiode PPD[n+1] there is a connection to a first transfer gate TX1[n+1] and a floating diffusion FD1 and on the other side of the pinned photodiode PPD1 there is a connection to a second transfer gate TX2[n+1] and a floating diffusion FD2. Readout circuitry 21 is connected to FD1 and readout circuitry 22 is connected to FD2. Transistors 22, 32, 42 are used for readout of rows n and n+1. Transistors 21, 31 and 41 are used for readout of rows n+1 and n+2. The array operates in rolling shutter mode, as follows. At a certain moment during readout, row n is read out. The photodiode PPPD[n] is read out through TX1[n] and TX2[n]. When the readout of the row is completed, the next row of pixels, row n+1, is read out. This includes pixel PPD[n+1], which is read out through TX1[n+1] and TX2[n+2]. This readout re-uses the buffer amplifier 22, select transistor 42 and reset transistor 32 used in the previous reading. When row n+2 is read out (photodiode PPD[n+2]), gates TX1[n+2] and TX2[n+2] are used. Amplifier 21, select transistor 41 and reset gate 31 are re-used. The total transistor count per pixel can be as small as five. Because of the sharing of floating diffusions between neighbouring pixels, the method of operation shown in FIG. 5, where a transfer gate is partially opened to allow excess charge to flow to the floating diffusion, cannot be used.

Figure 8A:
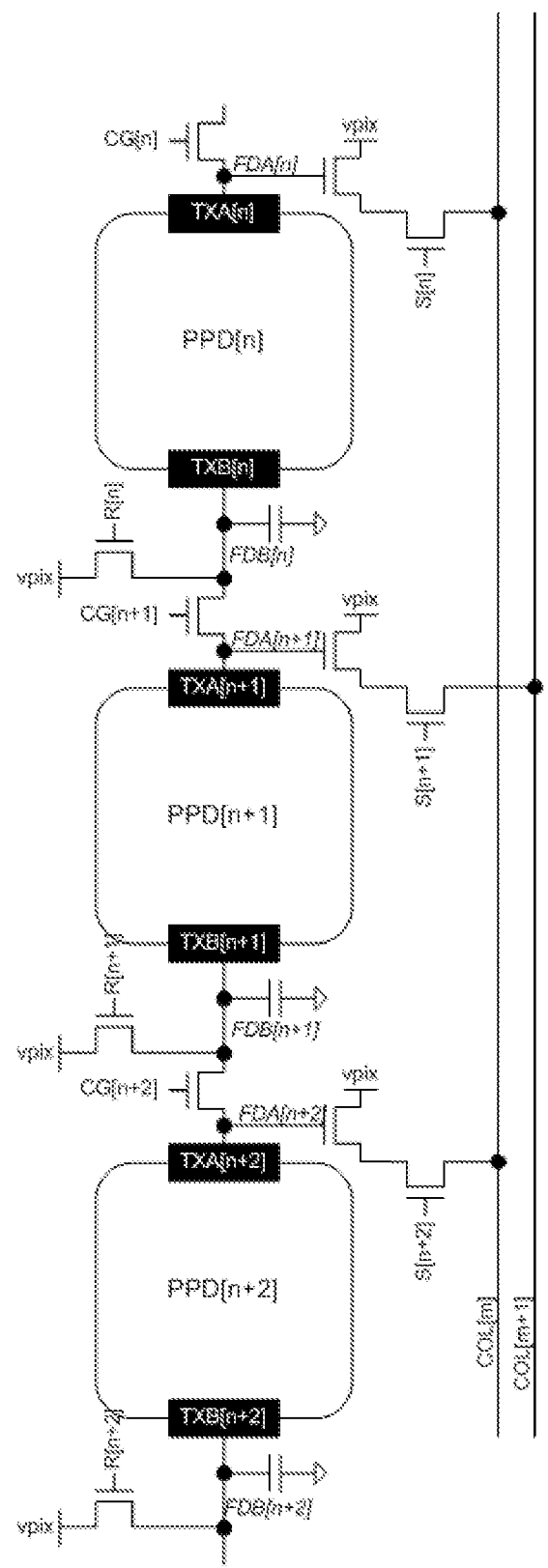

FIG. 8A shows another example of a shared pixel architecture using the pixel structure of FIG. 2, comprising photodiodes PPD[n], PPD[n+1] and PPD[n+2]. Each pixel structure contains two charge conversion elements (floating diffusions) FDA[n] and FDB[n] for pixel n, FDA[n+1] and FDB[n+1] for pixel n+1, FDA[n+1] and FDB[n+1] for pixel n+2. To enlarge the capacity of the floating diffusions, optionally a capacitor can be connected to this floating diffusion, as shown by example on FDB[n], FDB[n+1] and FDB[n+2]. Each pixel structure contains a reset transistor (R[n], R[n+1], R[n+2]) which are connected to FDB[n], FDB[n+1] and FDB[n+2]. The floating diffusions of neighbouring pixels are selectively connectable together by switches CG[n], CG[n+1] and CG[n+2]. Switch CG[n+1] connects floating diffusion FDB[n] to floating diffusion FDA[n+1]. Switch CG[n+2] connects floating diffusion FDB[n+1] to floating diffusion FDA[n+2]. Select transistors S[n], S[n+1] and S[n+2] and the (source follower) transistors with gate connected to FDA[n], FDA[n+1] and FDA[n+2] are used to read out the voltage levels of FDA[n], FDA[n+1] and FDA[n+2]. In the example of FIG. 8 the 'even' addressed pixels (n, n+2, . . . ) are read out to COL[m]. 'Odd' addressed pixels (n+1, n+3, . . . ) are read to COL[m+1].

The shared pixel architecture shown in FIG. 8A can be operated in three different modes:

High Conversion Gain Mode:
In this mode, the pixels are read out as separate (non-shared) pixels. Reset switches R[n], R[n+1] and R[n+2] are always conducting; floating diffusions FDB[n], FDB[n+1] and FDB[n+2] are constantly connected to vpix. Transfer gates TXB[n], TXB[n+1] and TXB[n+2] are constantly non-conducting. While a pixel is not being read out, the switches CG[n], CG[n+1] and CG[n+2] are conducting. At one moment, pixel n+1 and pixel n+2 are selected for readout. This operation is initiated by enabling the select switches S[n+1] and S[n+2] and disabling the CG switches CG[n+1] and CG[n+2]. The reset level on the floating diffusions FDA[n+1] and FDA [n+2] are available on COL[m+1] and COL[m] for readout. After reading this reset levels, the charges collected in photodiodes PPD[n+1] and PPD[n+2] are transferred to FDA[n+1] and FDA[n+2] through transfer gates TXA [n+1] and TXA[n+2]. The resulting voltage levels are available on COL[m+1] and COL[m] for readout.

Low Conversion Gain Mode:

In this mode, the pixels are read out as separate (non-shared) pixels. CG switches CG[n], CG[n+1] and CG[n+2] are always conducting; floating diffusions FDB[n], FDB[n+1] and FDB[n+2] are constantly connected to FDA[n+1], FDA[n+2] and FDA[n+3]. Transfer gates TXB[n], TXB[n+1] and TXB[n+2] are constantly non-conducting. While a pixel is not being read out, the reset switches R[n], R[n+1] and R[n+2] are conducting. At one moment, pixel n+1 and pixel n+2 are selected for readout. This operation is initiated by enabling the select switches S[n+1] and S[n+2] and disabling the reset switches R[n+1] and R[n+2]. The reset level on the floating diffusions FDA[n+1] (which is connected to FDB[n]) and FDA[n+2] (which is connected to FDB[n+1] are available on COL[m+1] and COL[m] for readout. After reading this reset levels, the charges collected in photodiodes PPD[n+1] and PPD[n+2] are transferred to FDA[n+1] (connected to FDB[n]) and FDA[n+2] (connected to FDB[n+1]) through transfer gates TXA[n+1] and TXA[n+2]. The resulting voltage levels are available on COL[m+1] and COL[m] for readout. The CG switches are always conducting, and the capacitance of the charge conversion node is then the sum of the capacitances of the FDA and FDB floating diffusions. This results in a lower charge-to-voltage conversion factor (or a lower gain in the pixel). The charge conversion node is reset through the reset transistor, and read before and after the transfer of charges through the transfer gate TX.

High Dynamic Range Mode

In this mode, the pixels are read out as shared pixels. While a pixel is not being read out, the reset switches R[n], R[n+1] and R[n+2], and the CG switches CG[n], CG[n+1] and CG[n+2] are conducting. Floating diffusions FDA[n], FDA[n+1], FDA[n+2], FDB[n], FDB[n+1], FDB[n+2] are at the reset level. At one moment, pixel n+1 is selected for readout. This operation is initiated by enabling the select switch S[n+1], disabling CG switch CG[n+1] and disabling reset switch R[n+1]. The reset level on the floating diffusions FDA[n+1] and FDB[n+1] (which is connected to FDA[n+2]) are available on COL [m+1] and COL[m] for readout. After reading this reset levels, the charges collected in photodiode PPD[n+1] are transferred to FDA[n+1] and FDB[n+1] (which is connected to FDA[n+2]) through transfer gates TXA[n+ 1] and TXB[n+1] using the overlapping transfer technique as illustrated in FIG. 4. The resulting voltage levels are available on COL[m+1] and COL[m] for readout.

Figure 9:
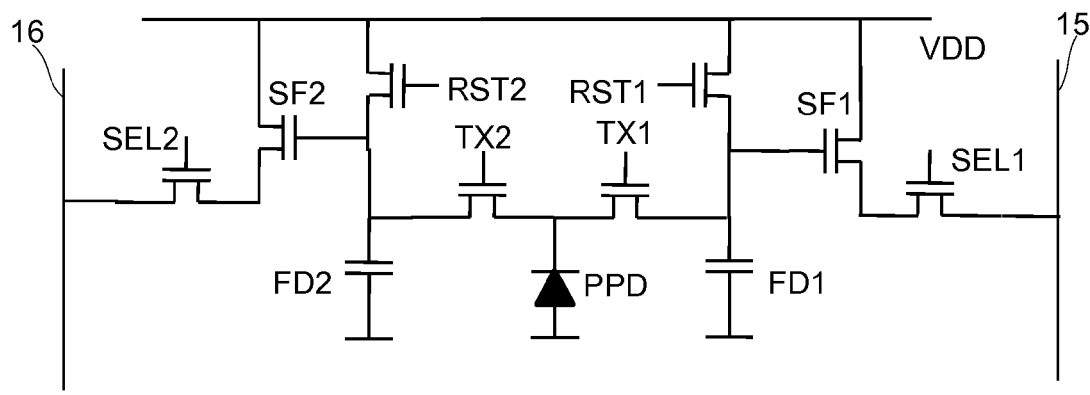
FIG. 9 schematically shows an embodiment of a pixel.

FIG. 9 shows an embodiment of a pixel structure with a photodiode connected to two transfer gates and two floating diffusions. This pixel can be used for rolling-shutter operation. The pixel structure comprises: a pinned photodiode PPD; two transfer transistors TX1, TX2; two reset transistors RST1, RST2; two source followers (buffer amplifiers) SF1, SF2 and two select transistors SEL1, SEL2. Each of the floating diffusions FD1, FD2 acts as a charge-to-voltage converter. As charge is transferred from the photodiode PPD to the floating diffusion, a voltage is formed across the floating diffusion. The floating diffusion has a conversion gain, which is dependent on the size of the floating diffusion. Each floating diffusion FD1, FD2 has a different conversion gain. When select transistor SEL1 is operated, a voltage across the floating diffusion is output to an output line 15 of the array, such as a column bus. The voltage across the floating diffusion FD1 is buffered by the source follower SF1. SF2 and SEL2 operate in the same way to read out a voltage from FD2 to an output line 16.

Figure 10:
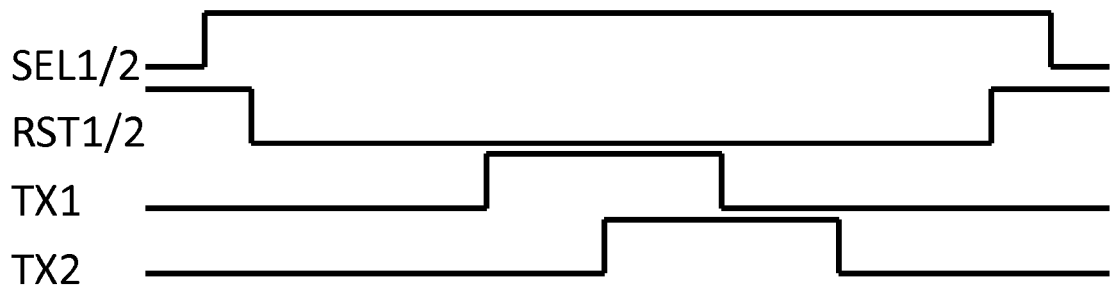
FIG. 10 shows a timing scheme for the pixel of FIG. 9.

A timing diagram for this pixel structure is shown in FIG. 10. RST1/2 is held low, thereby clearing charge from the FDs, before the TX signals are activated to transfer charge to the FDs. The TX gate TX1 associated with the floating diffusion FD1 having the lowest capacitance is activated first. This transfers charge to the most sensitive sense node first and, in the case where this sense node would saturate, the excess charge is moved to the next sensitive sense node, and so further until all sense nodes have been addressed. Transfer gate TX2 associated with the floating diffusion FD2 having the larger capacitance is activated later. Advantageously, there is an overlapping period when both transfer gates TX1, TX2 are operated. This corresponds to the step "charge transfer 2" shown in FIG. 3 and allows charge sharing between PPD, FD1 and FD2. The pixel can operate, with reduced performance, by switching off TX1 before switching on TX2. Advantageously, there is also a period when the first transfer gate is turned off, disconnecting the floating diffusion with the smallest capacitance first, and the second transfer gate TX2 is on. This corresponds to the step "charge transfer 3" shown in FIG. 3, and allows remaining charge to move to FD2.

Figure 11:
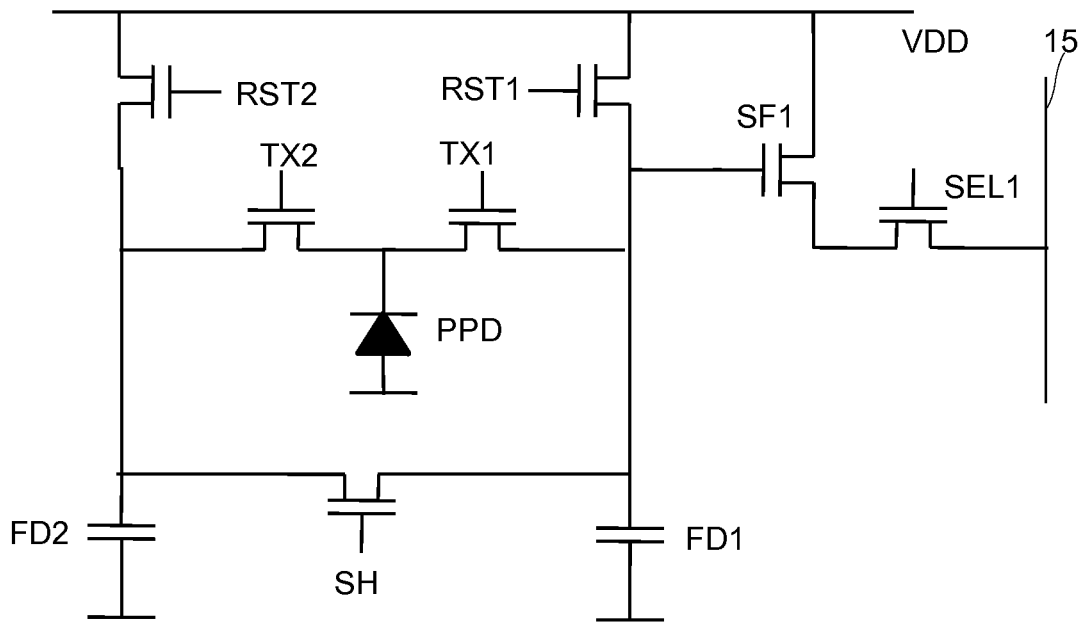
FIG. 11 schematically shows another embodiment of a pixel.

FIG. 11 shows an alternative pixel structure with a photodiode connected to two transfer gates and two floating diffusions. The pixel structure comprises: a pinned photodiode PPD; two transfer transistors TX1, TX2; two reset transistors RST1, RST2; one source follower (buffer amplifier) SF1; one select transistor SEL1; and a sample-and-hold transistor SH. In this case, only one output line 15 is needed for a pixel. SF1 and SEL1 comprise shared read out circuitry for the pixel. A signal is selectively read from one of the floating diffusions FD1, FD2 at a time to output line 15.

Figure 12:
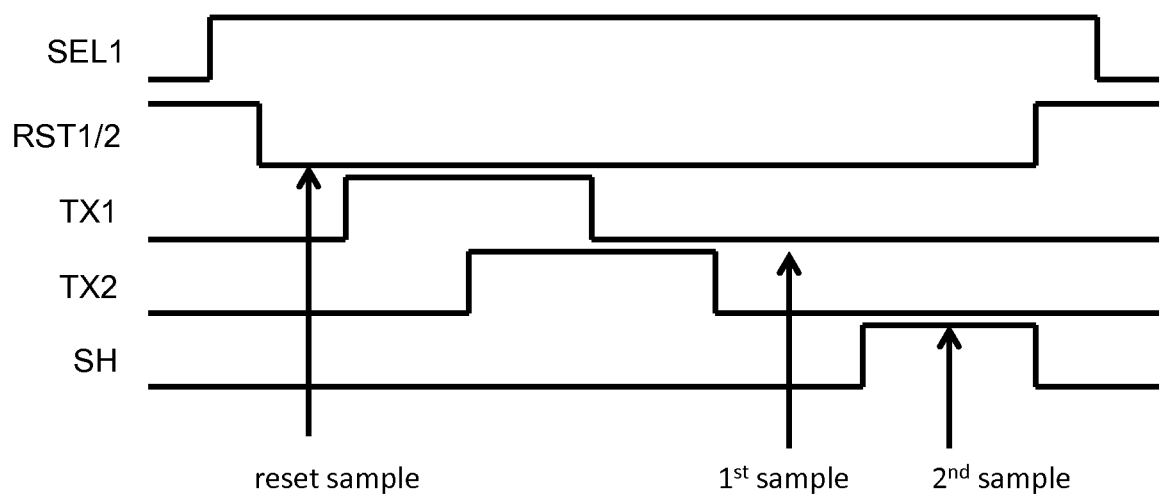
FIG. 12 shows a timing scheme for the pixel of FIG. 11.

A timing diagram for the pixel structure of FIG. 11 is shown in FIG. 12. A voltage across FD1 is read out in the same way as described for FIG. 9. Then, FD1 and FD2 are connected by operating transistor SH. An example of the pixel operation timing during readout is shown in FIG. 12. The "reset sample" gives the reset value of FD1 for Correlated Double Sampling (CDS) operation. The "$1^{st}$ sample" is the value read from FD1 and the "$2^{nd}$ sample" is the value read from FD1 and FD2, after SH has been activated to charge share between FD1 and FD2. In the pixel structure of FIG. 9 each FD1 and FD2 are individually read, and the signal read out from each FD represents charges on that FD. The situation is different in the pixel structure of FIG. 11. There is an attenuation of the signal of FD2 through the charge sharing between FD1 and FD2 at the moment when SH is closed. However, because of the capacitance ratio difference, and because the capacitance of FD2 is much larger than of FD1, this attenuation is not much. A drawback of this method is that the kTC noise of FD2 is not cancelled. With the method of FIG. 9, kTC noise is cancelled both on FD1 and FD2, since the reset levels of both floating diffusions can be read out. In the structure of FIG. 11, this is not possible. This means that the noise on the FD2 sample is larger. To keep the read noise of FD2 below the shot noise, the capacitance of FD2 should be smaller than when a separate readout channel would have been foreseen for FD2 (as in FIG. 9). This means that the dynamic range is not extended as much as it would have been with the structure of FIG. 9.

Figure 13:
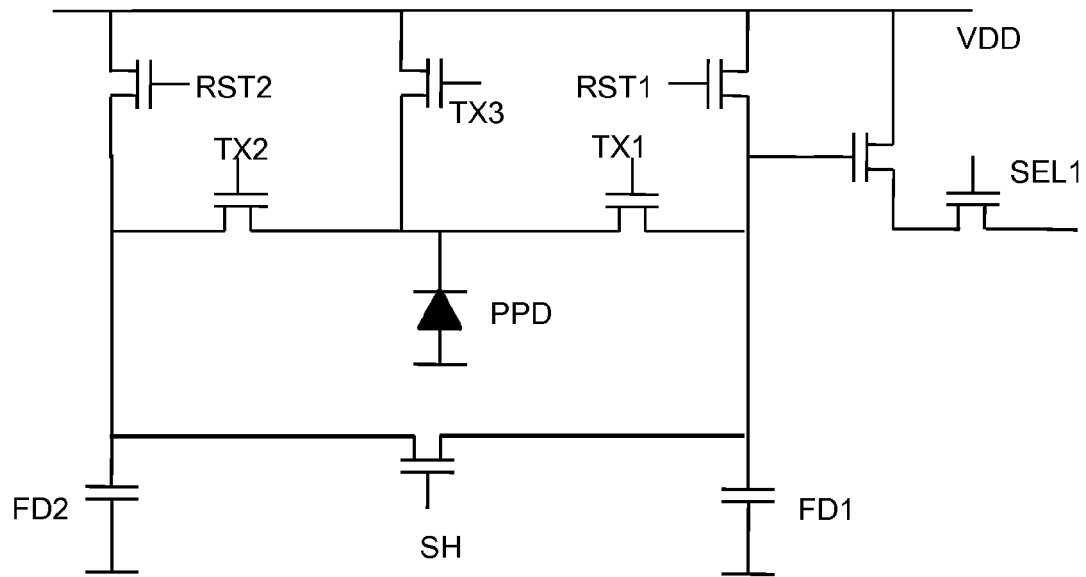
FIG. 13 schematically shows an embodiment of a pixel with global shutter operation.
Figure 14:
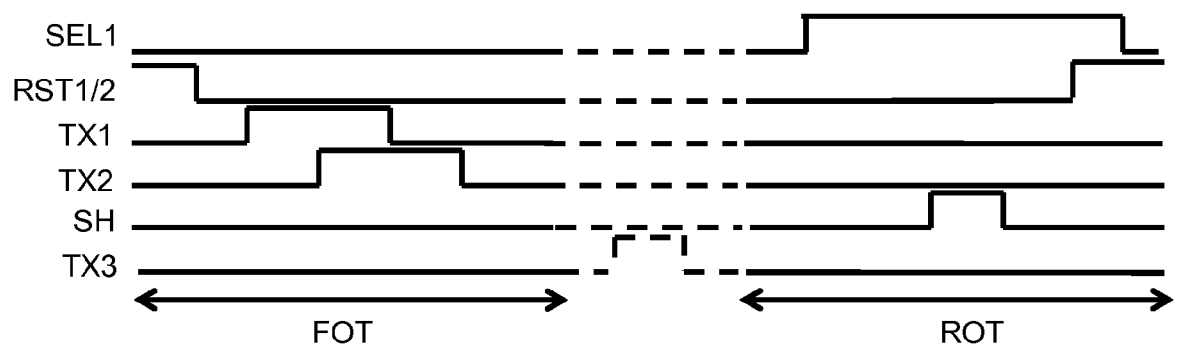
FIG. 14 shows a timing scheme for the pixel of FIG. 13.

FIG. 13 shows another pixel structure which is a modification of FIG. 11. Another transfer gate TX3 is added. This allows global shutter operation. FIG. 14 shows a timing diagram for the pixel of FIG. 13. During frame overhead time (FOT), all charges from the PPD can be transferred using the above explained multi-stage charge transfer scheme to both FD1 and FD2. During row overhead time (ROT), the SEL1 is switched on to read out the signal level on FD1. Then, the SH transistor is switched on to short FD1 and FD2. Then, the signal shared on both floating diffusions FD1, FD2 is read out as the $2^{nd}$ sample. When SH is off, RST1 is on so that the reset sample can be read out. TX3 switch is used to reset the PPD when the exposure of the frame starts. TX3 acts as an anti-blooming drain to drain away excess charges during the exposure and acts as a reset switch to control the reset moment of the photodiode.

Figure 15:
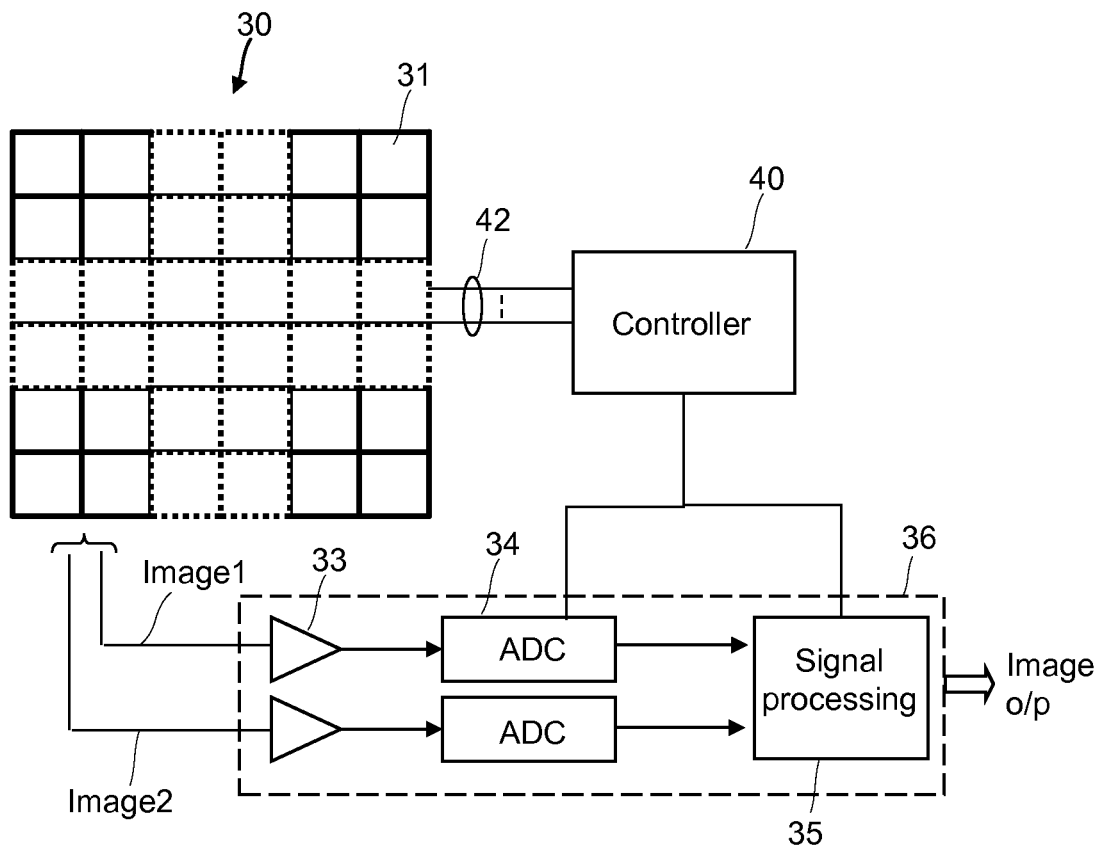
FIG. 15 schematically shows a pixel array architecture.

FIG. 15 shows an architecture of a pixel array and associated circuitry. A pixel array 30 comprises an array of individual pixels 31 which can be arranged as a 1D or 2D array. Each pixel 31 can have a form as shown in one of FIGS. 9, 11, 13, or a variant of one of these. Output circuitry 36 processes signal values obtained from each pixel 31 of the array 30. Each pixel will output at least a first image value (Image 1) representing a value of FD1, a second image value (Image 2) representing a value of FD2 (or a value resulting from charge sharing between FD1 and FD2 in the case of FIGS. 11 and 13). Other values can be output from a pixel if double sampling, or Correlated Double Sampling (CDS), is performed. In FIG. 15 it is assumed that the value of one, or both, of the signals obtained from a pixel are modified in the analog domain. An amplifier 33 is provided in the output path of each signal to apply a gain to the image value. An analog-to-digital converter (ADC) 34 digitises the analog signal value and a signal processing unit 35 processes the signal values (Image1, Image2) to derive an output image value. One function of the signal processing unit 35 is to reconstruct a signal from the two signal values (Image1, Image2). Signal processing unit 35, or a combination of signal processing unit 35 and gain applied by amplifiers 33, can restore a linear relation between the input light intensity of the pixel and the digital number associated to this value. One way of achieving this is amplify the two pixel readings (Image1, Image2) by a certain gain factor, and add the resulting signals. This is explained in more detail in later Figures. Many image storage formats have a dynamic range limitation (e.g. 8 bit). The signal processing unit 35 can compress the dynamic range of the image into the dynamic range of the image format to be output, which allows to represent the image in its full dynamic range without exceeding the signal range covered by the image format.

The output circuitry 36 shown in FIG. 15 can be shared by all outputs of the pixel array 30 on a time-shared basis. Alternatively, there can be an instance of the output circuitry 36 for each column, or other line of the array 30, to improve data throughput.

Controller 40 controls operation of the pixel array 30 and output circuitry 36. Controller 40 includes row selection/line driver circuitry for generating control signals on control lines 42 to drive pixels 31 in the array 30. Controller 40 controls: resetting of the pixels to control the integration period; operation of the transfer gates TX1, TX2 to transfer charges to the floating diffusions FD1, FD2; operation of switches RST1, RST2, SEL1, SEL2, SH to control read-out from a pixel. Example timing schemes for the control signals have been shown in FIGS. 10, 12 and 14. The pixel array can be read out in a conventional manner, with pixels being scanned on a row-by-row basis. Controller 40 can perform a global shutter function by synchronising operation of the control signals which control respective exposure times of each of the pixels of the array. Controller 40 also controls operation of the output circuitry. The control logic of controller 40 can be stored in hard-coded form, such as in an Application Specific Integrated Circuit, or it can be stored in some form of reconfigurable processing apparatus, such as a logic array (programmable array, reconfigurable array) or a general-purpose processor which executes control software. All of the elements shown in FIG. 15 can be provided on a single semiconductor device or the elements can be distributed among several separate devices.

One, or more, of the signals Image1, Image2 can be modified in the digital domain. In this case, amplifiers 33 are not required and digital values are manipulated by the signal processing unit 35, after A-to-D conversion 34. Processing in the digital domain has an advantage of avoiding the need for low noise amplifiers 33.

It is not always required to modify the value of the signals Image1, Image2 to linearise the response curve. In some cases, a non-linear light-to-digital number response compression can be used to fit the dynamic range of the image into the dynamic range of the image format.

In a further alternative, one or more of the signal values each corresponding to charge stored at a FD can be modified, and/or combined, by circuitry at the pixel itself. However, this requires a significant amount of additional circuitry per-pixel.

Figure 16:
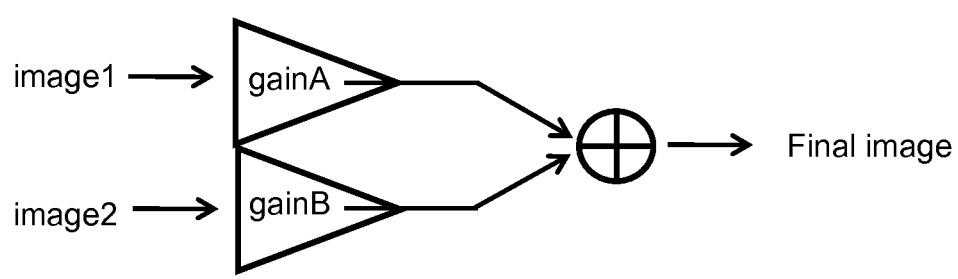
FIG. 16 shows a possible way of reconstruction of the final image from the two images.
Figure 17:
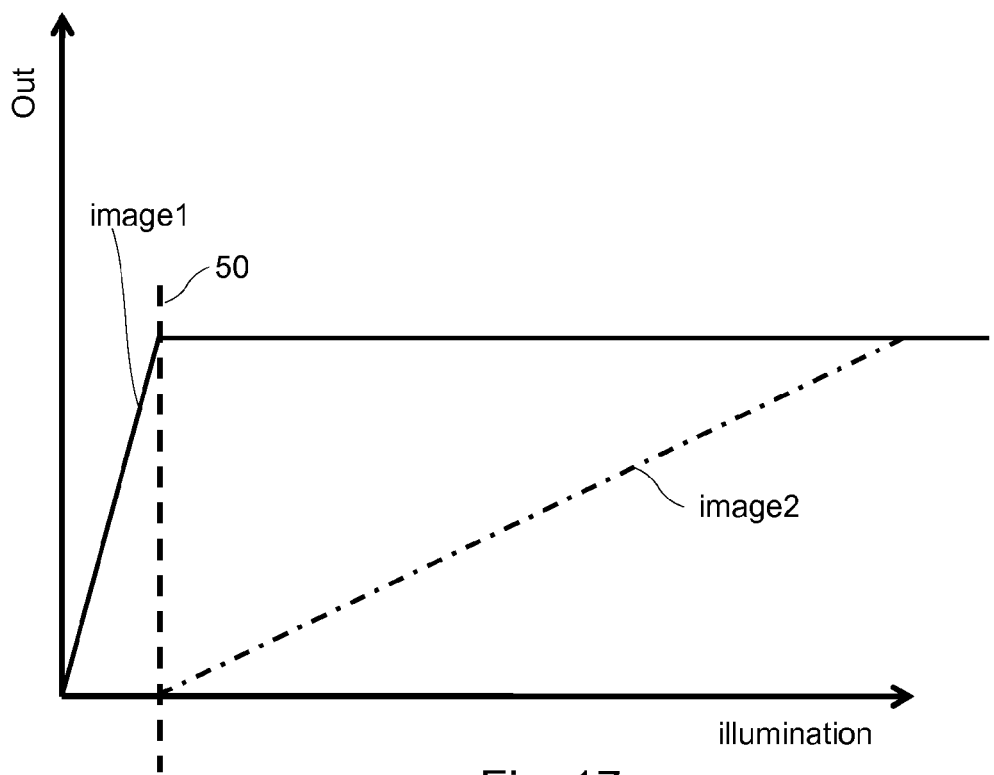
FIG. 17 shows responses of the two floating diffusions.

FIG. 16 shows an example of how the two image values Image1, Image2 obtained for a pixel are processed to derive a single image value for that pixel. A gain is applied to one, or both, of the signals Image1, Image2. In FIG. 17, a gain (gainA) is applied to Image1 and a gain (gainB) is applied to Image2. The two gain-adjusted signals are added. This can be performed in the analog or digital domain.

Figure 18:
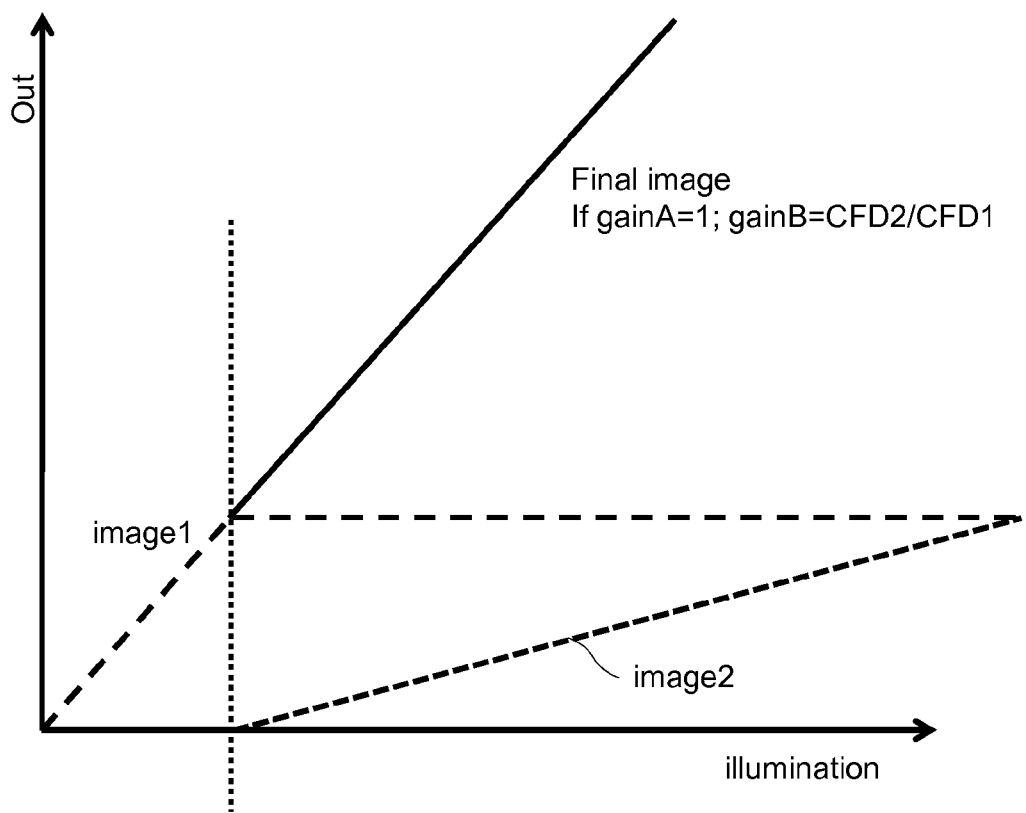
FIG. 18 shows reconstruction of an image from the signals obtained from the two floating diffusions.

FIGS. 17 and 18 show response curves of the two signals Image1, Image 2 obtained for a pixel. Recall that the first image value (Image 1) represents a value of FD1, and the second image value (Image 2) represents a value of FD2. The floating diffusions FD1, FD2 have different conversion gains. Floating Diffusion FD1 has a smaller capacity than floating diffusion FD2. FD1 quickly reaches a point 50 at which it is saturated, and cannot resolve an illumination level any higher. The relationship between illumination and signal value is relatively steep. The illumination level at which the floating diffusion reaches saturation is called the knee point. For floating diffusion FD2, with a larger capacity, the relationship between illumination and signal value is shallower, and it requires a much larger illumination value to cause FD2 to reach saturation. FIG. 18 shows the effect of gain-adjusting the responses of the image signals Image1, Image2. The response curve of Image2 is gain-adjusted so that it is equal to that of Image1. Adding the gain-adjusted signals results in the "final Image" plot. Suitable values for gain are gainA=1 and gainB=CFD2/CFD1, where CFD1 is the conversion gain of FD1 and CFD2 is the conversion gain of FD2.

In an alternative scheme, the gain may be not applied to linearise the response curve of Image2. This compresses the dynamic of the image into the available bit range.

Figure 19:
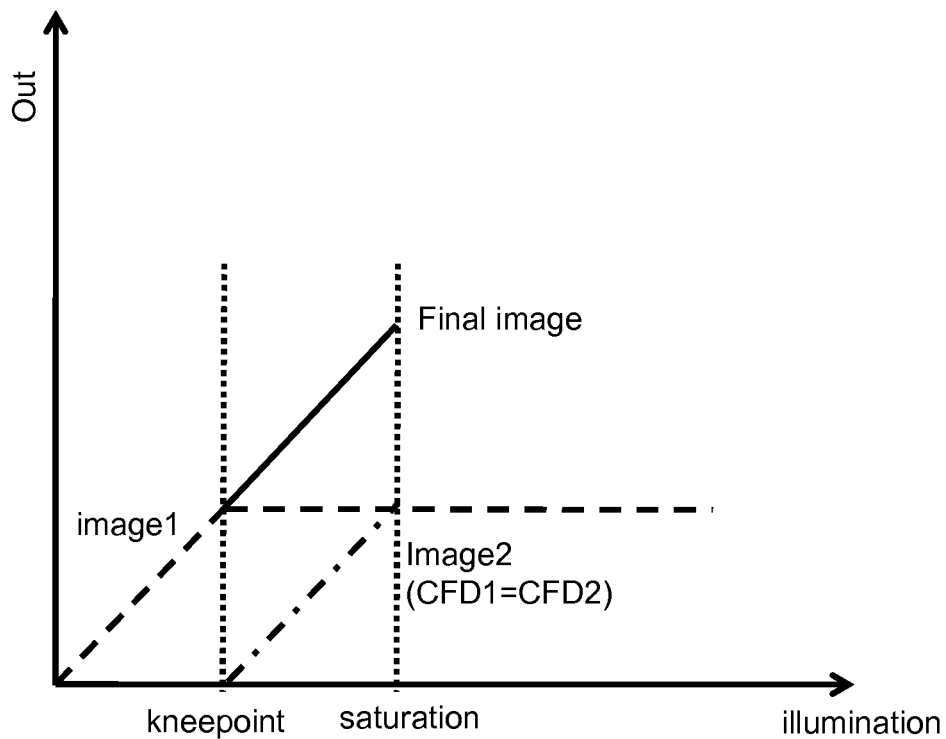
FIGS. 19 and 20 compare performance of a pixel structure having floating diffusions of equal size with a pixel structure having floating diffusions of different size.
Figure 20:
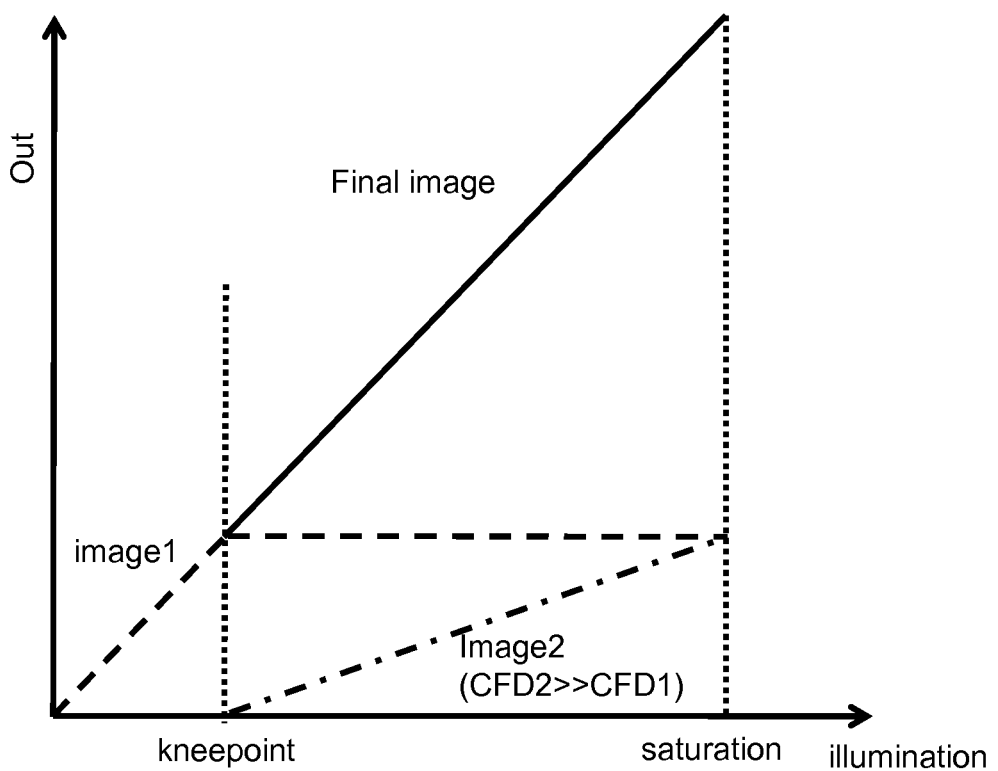

FIGS. 19 and 20 illustrate the effect of floating diffusions of different capacities. In FIG. 19 floating diffusion FD1 has the same capacity as floating diffusion FD2. The response lines of the two floating diffusions are similar. Both floating diffusions saturate with the same amount of charge/illumination. The pixel with two floating diffusions of equal size is able to resolve a total illumination level of approximately double that of the single floating diffusion. FIG. 20 shows a graph for floating diffusions of different capacities. This is a similar graph to FIG. 18. For floating diffusion FD2, with a larger capacity, the relationship between illumination and signal value is shallower, and it requires a much larger illumination value to cause FD2 to reach saturation. This extends the dynamic range of the pixel. The range of illumination values that can be resolved is much larger.

A further use of the pixel having multiple transfer gates and floating diffusions is that it can be advantageous to reduce the effects of incomplete charge transfer. In a conventional pixel, if a photodiode at the pixel has a small amount of charge, which is less than the value needed to saturate FD1, not all charge is transferred to FD1 when the transfer gate TX1 is opened. There is incomplete charge transfer, as shown by the response 61. In the pixel having multiple transfer gates and floating diffusions, according to embodiments of the invention, the remaining charge will move to FD2. The response curve 62 shows a higher output value for the same amount of illumination. Incomplete charge transfer can be caused by a width of a transfer gate which is too small. On the other hand, a wider transfer gate would result in a floating diffusion with a higher capacitance and a lower conversion gain. For low noise readout, it is desirable to keep the conversion gain on FD1 as high as possible. This can be realised by a smaller transfer gate. In traditional pixel designs, this would not be allowed because of the risk on incomplete charge transfer. This means that a certain number of charges, typically proportional to the photosignal and, at maximum a few percent, remain on the photodiode. It appears as image lag. In the pixel structure described in embodiments of the invention, this risk is mitigated by the second transfer gate which transfers any remaining charge on the photodiode to FD2. As this gate is wider, it will more effectively transfer these charges.

A second reason of image lag is a possible potential barrier close to the transfer gate due to local concentration variations of the dopant implants. Since the TX1 gate width is relatively small, such barrier could appear close to TX1. Since the TX2 gate can be located at the opposite side of the photodiode, far away from TX1, it may also be effective to drain away charges that were not transferred to TX1 due to such barrier.

A third mechanism for image lag is caused when the voltage difference between the floating diffusion and the photodiode is very small. In cases when the floating diffusion is very small, this occurs close to saturation of the floating diffusion level. With the pixel structure described in embodiments of the invention, charge that remains on the photodiode due to saturation of FD1, will be transferred to FD2 via TX2.

Embodiments of this invention allow read out of a signal with an extended dynamic range. The low capacitance of floating diffusion FD1 creates a high gain readout. During readout, noise is added. This noise is mainly added in the source follower in the pixel, which is the buffer amplifier present in the pixel. A well-designed source follower in a CMOS active pixel has a readout noise of approximately 250 μV RMS. For the detection of photocharges, the noise must be calculated back to the electron domain. Since FD1 can be operated with a low capacitance, and consequently a high conversion gain, this 250 μV RMS noise translates into a low noise number expressed in electrons. Table 1 shows the calculation. In the example given in table t, a very low floating diffusion capacitance is considered for FD1, down to 1.28 fF. Such low value can be realized in modern CMOS processes. It results in a conversion gain of 125 μV/electron. The read noise is limited to 2 electrons RMS. The swing on the floating diffusion is approximately 1V. This means that the floating diffusion saturates after a charge of 8000 electrons has been transferred. Remaining charge will be shared between the photodiode and the floating diffusion. When TX2 is opened, this charge will move completely to FD2. FD2 has a 10× higher capacitance in the given example of table 1. This results in a saturation level of FD2 of 80,000 electrons. The read noise on the FD2 channel is 20 electrons. However, a charge packet that saturates FD1 is 80,000 electrons which has a photon shot noise of 89 electrons (=square root of 80,000). This photon shot noise is clearly dominant over the 20 noise electrons of the FD2 reading. The dynamic range is 880,000 electrons/2 electrons or more than 92 dB. A traditional pixel would have a dynamic range of only 72 dB (=20*log(8,000/2)).

In the above mentioned example, the kTC noise on FD2 corresponds to 45 electrons. Since this value is well below the shot noise of the FD1 channel, a scheme with charge sharing to reduce the number of output lines (as shown in the pixel of FIG. 13) can also be used without a noticeable increase in read noise.

With such low read noise number, other noise sources may become important but this does not limit the applicability of the invention.

Figure 22:
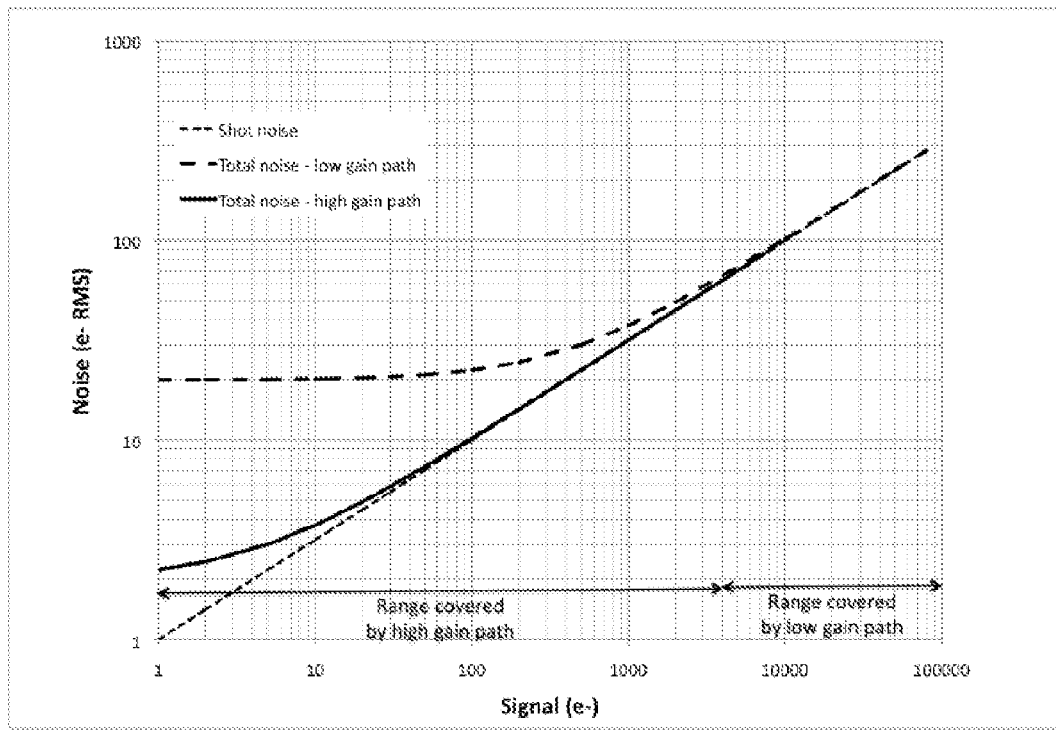
FIG. 22 shows noise performance of the pixel.

FIG. 22 shows the read noise in function of the photosignal. The square root of the photosignal is the photon shot noise, which is indicated by the dotted straight line. The read noise in dark of the low gain path (FD2) and high gain path (FD1) must be added, which is shown in the two other curves. The high gain path curve saturates at 8000 electrons. At this moment this curve is dominated by photon shot noise. At this moment, also the curve of the low gain path is already dominated by photon shot noise.

TABLE 1 numerical example of the calculation of the read noise in both gain paths, and the resulting dynamic range

| Parameter | Low gain path | High gain path | Unit |
| --- | --- | --- | --- |
| Floating diffusion | FD2 | FD1 | |
| Gain ratio | 1 | 16 | |
| Conversion gain | 12.5 | 125 | μV/e- |
| Saturation | 80000 | 8000 | e- |
| Swing | 1 | 1 | V |
| Shot noise at saturation | 283 | 89 | e- |
| Max. read noise | 20 | 2 | e- RMS |
| Max. read noise | 250 | 250 | μV RMS |
| Dynamic range of the channel | 72 | 72 | dB |
| Total dynamic range | 93 | | dB |
| Cfd | 12.8 | 1.28 | fF |

Figure 23:
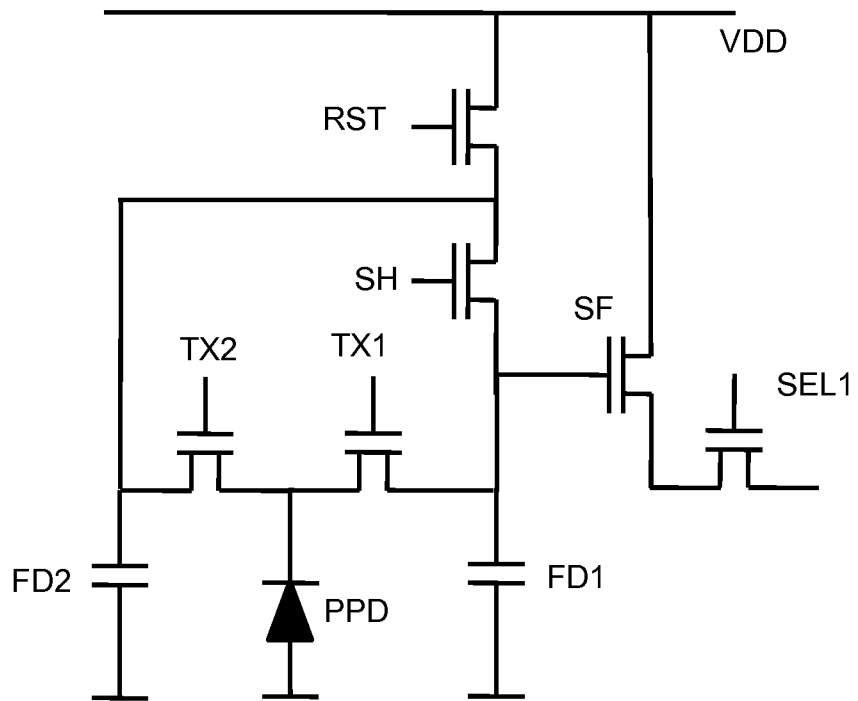
FIG. 23 schematically shows an embodiment of a pixel with global shutter operation.
Figure 24:
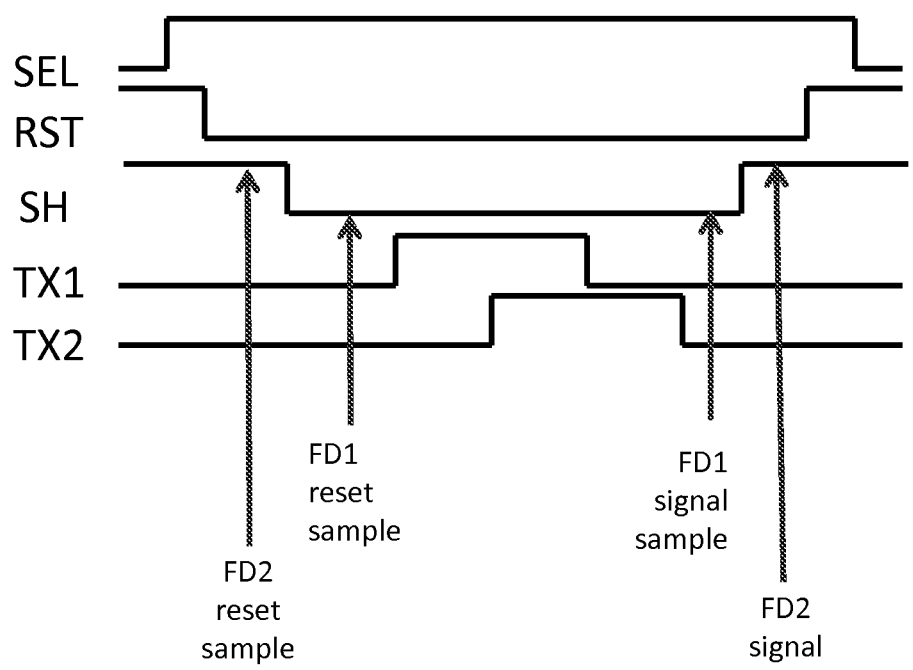
FIG. 24 shows a timing scheme for the pixel of FIG. 23.

FIG. 23 shows an alternative pixel structure with a photodiode PPD connected to two transfer gates TX1, TX2 and two floating diffusions FD1, FD2, similar to FIG. 11. The pixel now contains only one reset transistor RST, compared to two separate reset transistors in the pixel of FIG. 11. The pixel structure of FIG. 23 comprises: a pinned photodiode PPD, two transfer transistors TX1, TX2; one reset transistor RST; one source follower (buffer amplifier) SF; one select transistor SEL1; and a sample-and-hold transistor SH. In this case, only one output line is needed for the pixel, and only one reset line RST is needed for the pixel. SF and SEL1 comprise shared readout circuitry for the pixel. A signal is selectively read from one of the floating diffusions FD1, FD2 at a time to the output line. A timing diagram for the pixel structure of FIG. 23 is shown in FIG. 24. A voltage across FD1 is read out in the same way described for the pixel of FIGS. 9 and 11. Then, FD1 and FD2 are connected by operating transistor SH, in the same way as described for FIG. 11. The timing of reset of the floating diffusions of the pixel is slightly different from FIG. 12. The floating diffusion FD2 is now reset through the RST and SF transistors. This means that also the SF transistor must be pulsed to reset FD2. An example of the pixel operation timing during readout is shown in FIG. 12. The reset sample is now separately measured for the FD2 and FD1 floating diffusions. First, the floating diffusions are reset. After the falling edge on RST, the reset level of FD2 is sampled. Then, after the falling edge on SH, the reset level of FD1 is sampled. Then, the charge of the photodiode is moved identically to the implementations in FIGS. 9 and 11. First the charge is moved to FD1 by activating the TX1 transfer gate. Any remaining charge on the photodiode is then moved to FD2 by activating the TX2 transfer gate. Then TX1 is switched off, and sequentially TX2 is switched off. Then, the floating diffusions can be read out. FD1 is read first, after the falling edge on TX2. Then, SH is switched on again and FD2 can be read.

Figure 25:
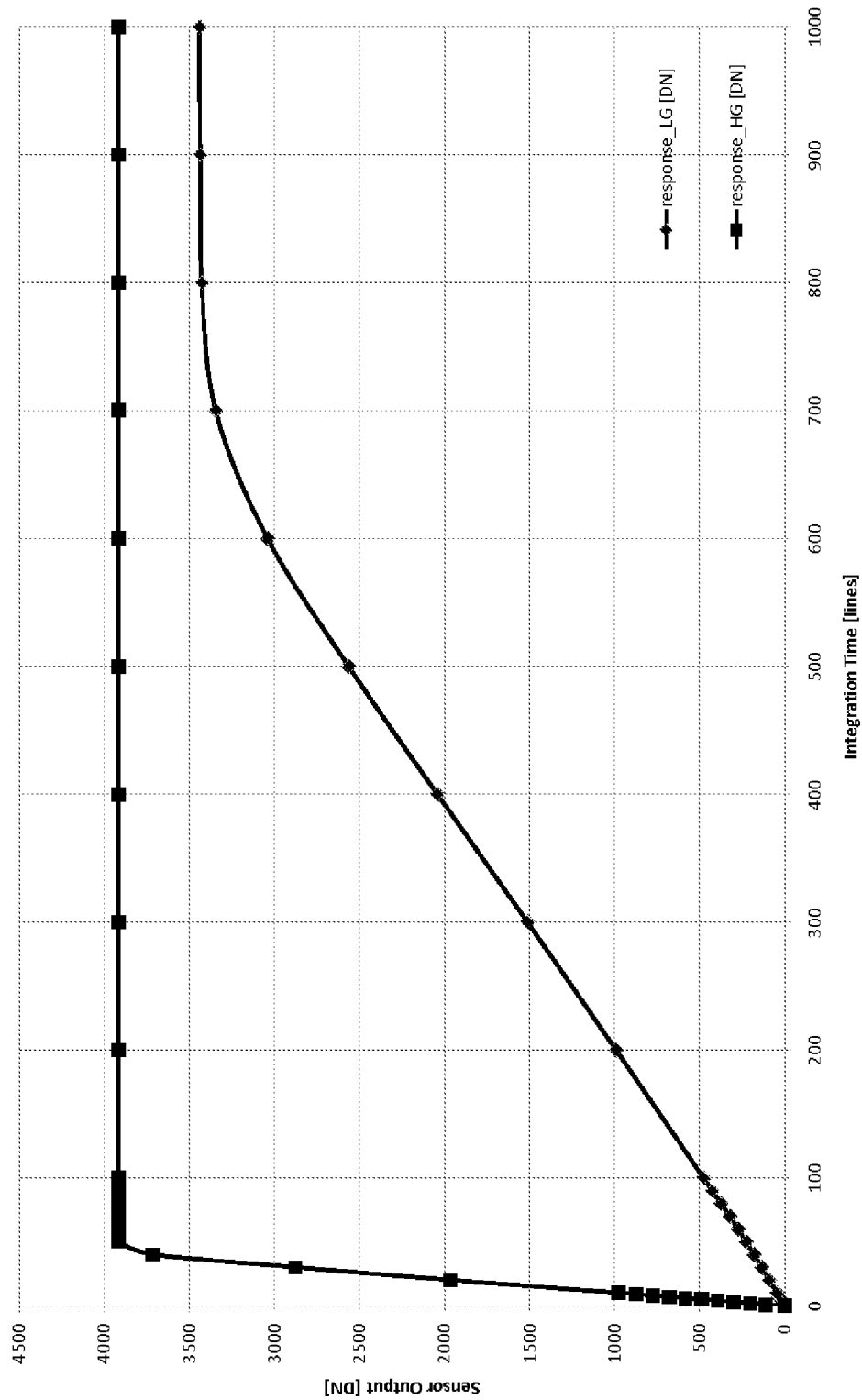
FIG. 25 shows measurement results for the pixel of FIG. 23.

FIG. 25 shows the measurement results of the pixel shown in FIG. 23, plotting the pixel response (as a digital number) versus integration time (thus the photon-generated electrons). The difference in sensitivity is the ratio of FD1 and FD2, multiplied by the different gain applied in the sensor readout path.

Figure 26:
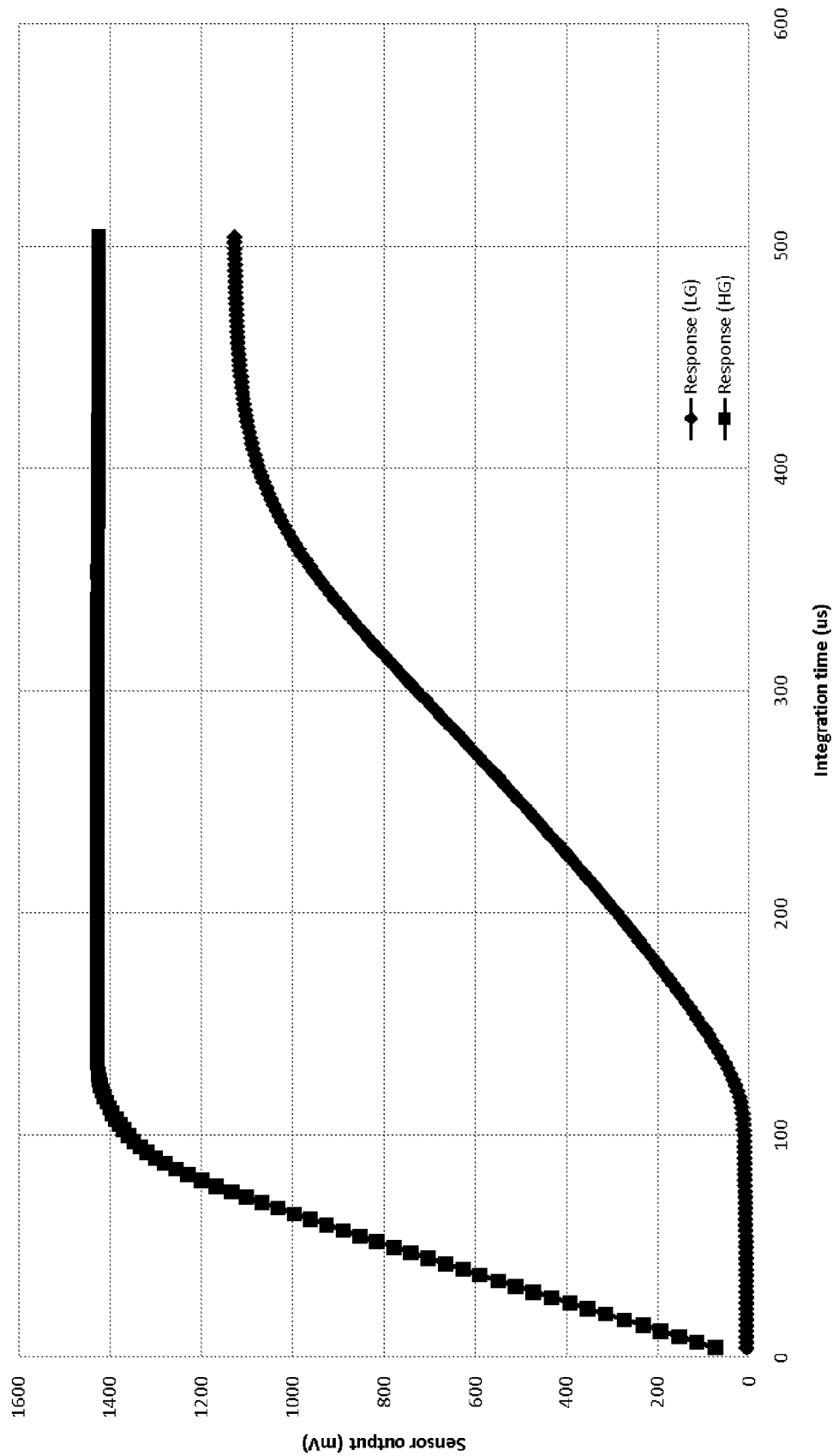
FIG. 26 shows measurement results for the pixel of FIG. 9.

FIG. 26 shows the measurement results of the pixel shown in FIG. 9. The experimental results confirm the predicted response curve shown in FIG. 17.

Figure 27:
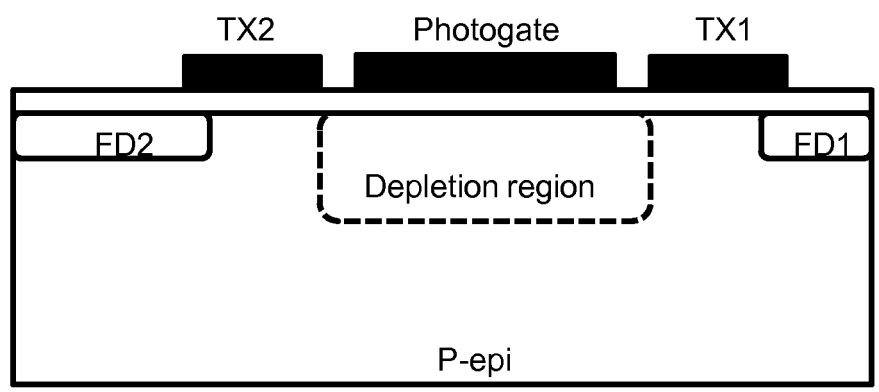
FIG. 27 shows part of a pixel structure according to an embodiment of the invention, applied to a photogate pixel.
Figure 28:
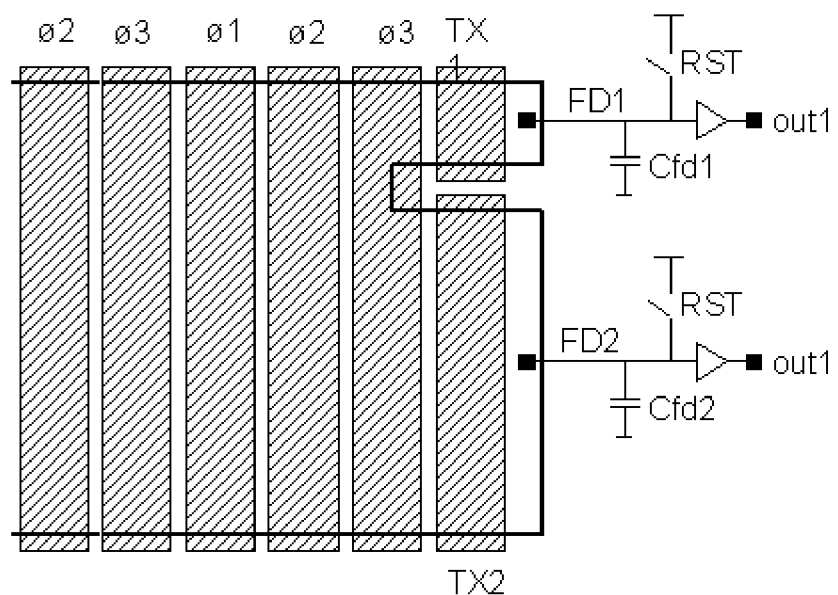
FIG. 28 shows part of a pixel structure according to an embodiment of the invention, applied to a CCD.
Figure 29:
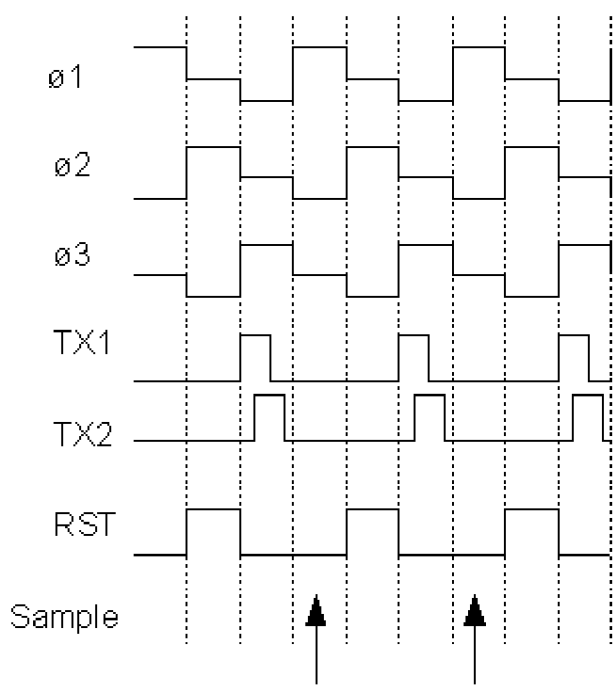
FIG. 29 shows a timing scheme for the pixel of FIG. 28.

The embodiments described above have a pinned photodiode as a photo-sensitive element. Other embodiments apply the same ideas to a photogate pixel where charge, generated in response to illumination, is stored under a gate instead of in the pinned photodiode. FIG. 27 shows a similar drawing to FIG. 2, with a photogate instead of a depletion region. Any of the features described above in relation to photodiodes can be applied to embodiments using a photogate. It is also possible to use the idea of multiple transfer gates to Charge Coupled Device (CCD) output stages, as shown in FIGS. 28 and 29. The charge does not come from a photodiode in this case, but from a CCD channel underneath the CCD gate of the last stage before the output stage. The floating diffusion and transfer gate stages are split into multiple gates, connected to different floating diffusions. In this embodiment, the photo-sensitive element can be located in a photodiode or under one of the CCD gates. In the drawings, charge is already present under one of the gates o1, o2 or o3. The charge resides under the gate with the highest potential. This charge is moved by subsequent pulsing of the gates with different voltages. At the output, it is dumped on a floating diffusion as in a CMOS pixel. In this embodiment of the invention, this floating diffusion is split into two parts: FD1 and FD2 which are connected to the CCD through transfer gates TX1 and TX2.

The invention is not limited to the embodiments described herein, which may be modified or varied without departing from the scope of the invention.

The invention claimed is:

1. A pixel structure comprising:
    a photo-sensitive element configured to generate a charge in response to incident light;
    a first transfer gate connected between the photo-sensitive element and a first charge conversion element;
    a second transfer gate connected between the photo-sensitive element and a second charge conversion element;
    an output stage arranged to output a first value related to charge at the first charge conversion element and output a second value related to charge at the second charge conversion element;
    a controller arranged to control operation of the pixel structure, the controller being arranged to cause the pixel structure to:
    switch off both the first and second transfers gates to acquire charges on the photo-sensitive element during an exposure period, wherein said exposure period corresponds to a time period during which the first and second transfer gates are switched off and during which the photo-sensitive element is exposed to an incident light;
    switch on the first transfer gate to transfer a first portion of the charges acquired during said exposure period from the photo-sensitive element to the first charge conversion element via the first transfer gate; and
    switch on the second transfer gate to transfer a second portion of the charges acquired during said exposure period from the photo-sensitive element to the second charge conversion element via the second transfer gate, wherein the second portion of the charges corresponds to remaining charges acquired during said exposure period.

2. The pixel structure according to claim 1, wherein the second charge conversion element has a larger capacitance than the first charge conversion element.

3. The pixel structure according to claim 2, wherein the controller is arranged to transfer charges to the first charge conversion element before transferring charges to the second charge conversion element.

4. The pixel structure according to claim 1, wherein the second transfer gate is wider than the first transfer gate.

5. The pixel structure according to claim 1, wherein the output stage comprises a first read out circuitry for outputting a value related to charge at the first charge conversion element and second read out circuitry for outputting a value related to charge at the second charge conversion element.

6. The pixel structure according to claim 1, wherein the output stage comprises shared read out circuitry for selectively outputting a value related to charge at the first charge conversion element and for selectively outputting a value related to charge at the second charge conversion element.

7. The pixel structure according to claim 6, further comprising a switch positioned between the first conversion element and the second conversion element.

8. The pixel structure according to claim 1, wherein the photo-sensitive element is one of: a pinned photodiode; and a photogate.

9. The pixel structure according to claim 1, wherein the first charge conversion element and the second charge conversion element are floating diffusions.

10. The pixel structure according to claim 1, wherein the controller is further arranged to:
    operate the second transfer gate for an overlapping period with the operation of the first transfer gate.

11. The pixel structure according to claim 1, wherein the controller is arranged to operate the second transfer gate for a period which extends beyond operation of the first transfer gate.

12. The pixel structure according to claim 1, wherein the controller is further arranged to:
    during the exposure period, operate the second transfer gate to allow overflow charge to transfer to the second charge conversion element;

cause the output stage to output a third value related to charge stored in the second charge conversion element; and reset the second charge conversion element before transferring a first portion of the charges to the first charge conversion element and transferring the second portion of the charges to the second charge conversion element.

13. The pixel structure according to claim 1, comprising N transfer gates and N charge conversion elements, where N is an integer ≥3, each transfer gate connected between the photo-sensitive element and a respective charge conversion element, and wherein the output stage is arranged to output a value related to charge at each of the N charge conversion elements.

14. A pixel array comprising a plurality of pixel structures according to claim 1.

15. The pixel array according to claim 14, wherein the first charge conversion element and the second charge conversion element of one pixel structure are shared with neighboring pixel structures in the array.

16. The pixel array according to claim 14, further comprising a switch arranged to selectively connect the first charge conversion element of one pixel structure to the second charge conversion element of a neighboring pixel structure in the array.

17. The pixel array according to claim 14, wherein one or more charge conversion elements of one pixel structure are connected through one or more switches to one or more charge conversion elements from a neighboring pixel structure.

18. The pixel array according to claim 14, further comprising array output circuitry arranged to receive the first value and the second value from a pixel and to combine the values.

19. The pixel array according to claim 18, wherein the array output circuitry is further arranged to modify at least one of the first value and the second value before combining them.

20. The pixel array according to claim 19, wherein the array output circuitry is arranged to modify at least one of the first value and the second value to compensate for the different conversion gains of the first charge conversion element and the second charge conversion element.

21. The pixel array according to claim 19, wherein the array output circuitry is arranged to apply a gain to at least one of the first value and the second value.

22. The pixel structure according to claim 1, wherein the first and second transfer gates and the first and second charge conversion elements are split into a plurality of charge coupled device (CCD) gates and the photo-sensitive element is located under one of the CCD gates.

23. A method of operating a pixel structure comprising a photo-sensitive element for generating charge in response to incident light, a first transfer gate connected between the photo-sensitive element and a first charge conversion element, a second transfer gate connected between the photo-sensitive element and a second charge conversion element and an output stage, the method comprising:

switching off both the first and second transfer gate to cause the photo-sensitive element to acquire charges during an exposure period, wherein said exposure period corresponds to a time period during which the first and second transfer gates are switched off and during which the photo-sensitive element is exposed to an incident light;

switching on the first transfer gate to transfer a first portion of the charges acquired during said exposure period from the photo-sensitive element to the first charge conversion element via the first transfer gate; and switching on the second transfer gate to transfer a second portion of the charges acquired during said exposure period from the photo-sensitive element to the second charge conversion element via the second transfer gate, wherein the second portion of the charges corresponds to remaining charges acquired during said exposure period.

24. The method according to claim 22, wherein the first charge conversion element has a smaller capacitance than the second charge conversion element and the method comprises transferring charges to the first charge conversion element before transferring charges to the second charge conversion element.

* * * * *